United States Patent
Umemoto et al.

(10) Patent No.: US 6,271,548 B1
(45) Date of Patent: *Aug. 7, 2001

(54) MASTER SLICE LSI AND LAYOUT METHOD FOR THE SAME

(75) Inventors: Yasunobu Umemoto; Yukinori Uchino; Toshikazu Sei; Muneaki Maeno, all of Kanagawa-ken (JP)

(73) Assignee: Kabushiki Kaisha Toshiba, Kawasaki (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/859,108

(22) Filed: May 20, 1997

(30) Foreign Application Priority Data

May 24, 1996 (JP) .................................... 8-130282
May 14, 1997 (JP) .................................... 9-124432

(51) Int. Cl.[7] .................................................. H01L 27/10
(52) U.S. Cl. ............................ 257/202; 257/206; 257/208
(58) Field of Search ........................ 257/208, 210, 257/202, 206; 395/500.13, 500.14

(56) References Cited

U.S. PATENT DOCUMENTS

| | | | |
|---|---|---|---|
| 4,644,187 | * 2/1987 | Haji | 397/303 |
| 5,045,725 | * 9/1991 | Sasaki et al. | 307/465 |
| 5,365,091 | * 11/1994 | Yamagishi | 257/208 |
| 5,583,788 | * 12/1996 | Kuribayashi | 257/208 |
| 5,612,553 | * 3/1997 | Arakawa | 257/206 |
| 5,636,129 | * 6/1997 | Her | 365/500.13 |
| 5,656,834 | * 8/1997 | Grzyb et al. | 257/208 |
| 5,793,643 | * 8/1998 | Cai | 365/500.13 |
| 5,801,959 | * 9/1998 | Ding et al. | 365/500.13 |
| 5,808,341 | * 9/1998 | Maeda et al. | 257/349 |
| 5,990,502 | * 11/1999 | Park | 257/202 |

* cited by examiner

Primary Examiner—Olik Chaudhuri
Assistant Examiner—Phat X. Cao
(74) Attorney, Agent, or Firm—Foley & Lardner

(57) ABSTRACT

A master slice layout technology is provided to improve integration density of a semiconductor integrated circuit such as ASIC. In particular, a plurality of gate basic cells are arranged on a semiconductor chip and then a wiring channel grid having non-uniform pitches is defined on the gate basic cells. If a layout of metal wirings is designed along the wiring channel grid, miniaturizable patterns can be set to smaller values while maintaining line widths of predetermined metal wirings such as power supply wirings at preselected values. Since flexibility for the layout of the metal wiring layers is large, miniaturization of the patterns can be attained even if design rules for basic cell process and wiring process are different.

25 Claims, 28 Drawing Sheets

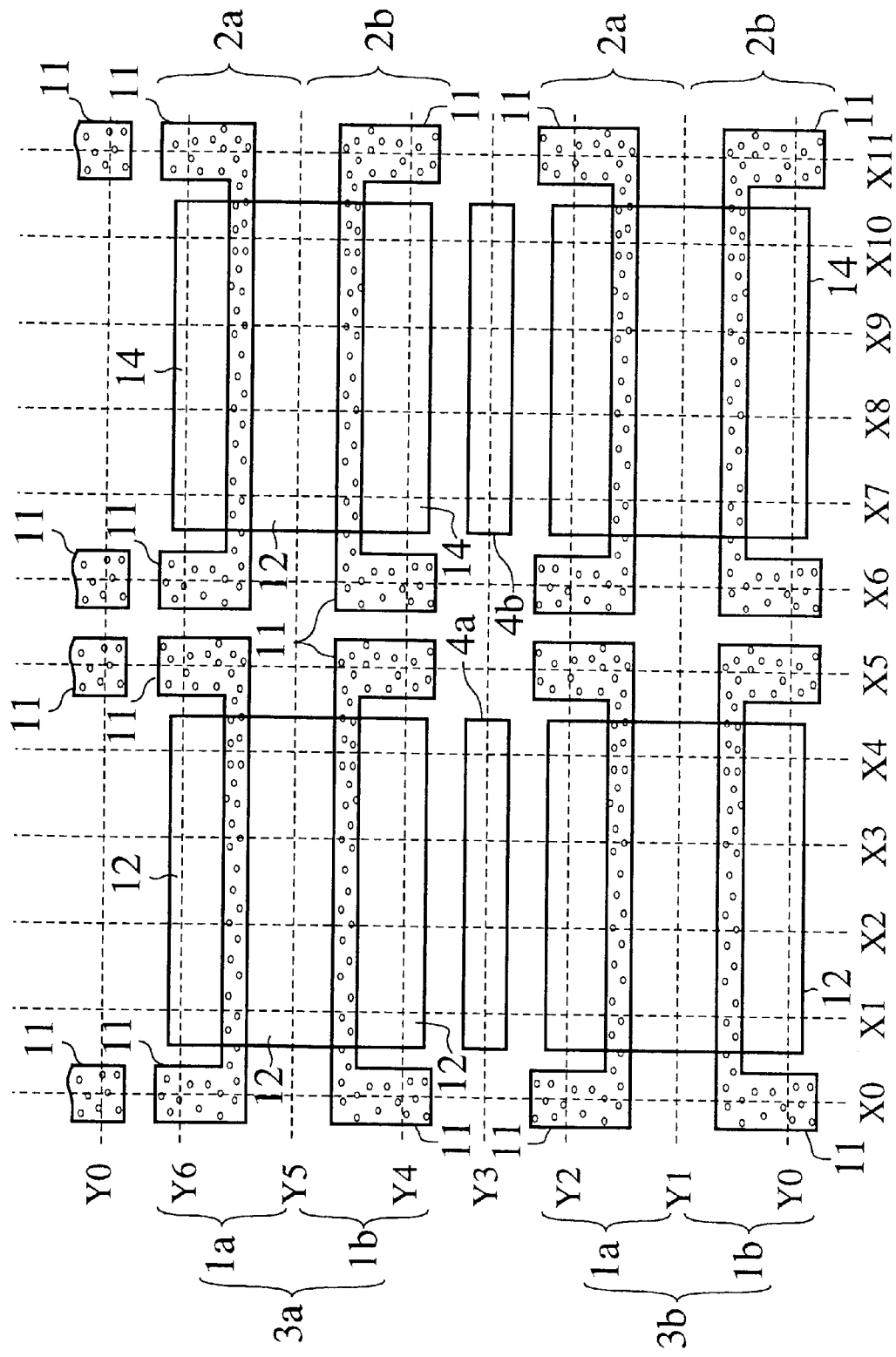

MASTER SLICE LSI AND LAYOUT METHOD FOR THE SAME

BACKGROUND OF THE INVENTION

1. Field of the Invention

The present invention relates to a semiconductor device employing a master slice layout in which a plurality of gate basic cells are formed previously on an LSI chip and then only a wiring design is added to construct desired logic circuits, and to a configuration of a semiconductor device and a layout design thereof capable of improving miniaturization of wiring patterns and integration density.

2. Description of the Prior Art

Various layout designs for a semiconductor integrated circuit may be prepared according to a scale of the integrated circuit and design approach. A fully-custom IC in which all layers are designed and manufactured for exclusive use is suited for the case where a large number of high performance ICs are to be manufactured. In contrast, a semicustom IC such as Application-Specific Integrated Circuits (ASICs) in which layers located below a wiring layer level are manufactured in advance and then only wiring layers are designed and manufactured is suited for the case where specific-application ICs are to be manufactured in a short term. In addition, the semicustom IC has such an advantage that design cost and production cost can be reduced. Such ASIC is also called a gate array or master slice layout. An example of the basic cell layout of the semiconductor integrated circuit of this type is shown in FIG. 1A.

The layout shown in FIG. 1A is composed of two gate basic cells $3a$, $3b$ and substrate/contact regions $4a$, $4b$ formed between the gate basic cells $3a$, $3b$. Respective gate cells $3a$, $3b$ are composed of two source/drain diffusion regions 12, 14 and four gate polysilicon regions 11. In FIG. 1A, for example, if a two-input NAND gate is to be formed, the gate basic cells $3a$, $3b$ comprising two n-MOS transistors $1a$, $1b$ and two p-MOS transistors $2a$, $2b$ respectively are arranged on the upper and lower sides to put the substrate/contact regions $4a$, $4b$ therebetween, whereby constituting one block. In FIG. 1A, in a wiring channel grid serving as a basis when the wiring layers are designed, for instance, twelve lines X0 to X11 are specified in the X direction and seven lines Y0 to Y6 are specified in the Y direction.

In the layout of the gate basic cell in which the wiring channel grid is specified in this manner, as shown in a functional block layout pattern in FIG. 1B, for example, four-input (A, B, C, D) one-output (Z output) NAND gate is constructed by designing the layout of the wirings of the transistors $1a$, $1b$, $2a$, $2b$ with the use of vertical metal wirings VDD (higher potential) power supply wiring $5a$, and VSS (lower potential) power supply wiring $5b$) and a lateral metal wiring (connection wiring 6).

In the prior art, in the layout of the gate basic cell, pitches of the wiring channel grid are defined as a uniform value or defined uniformly in the X and Y directions respectively to make much account of its matching to layout CAD. Design values of the pitches of the wiring channel grid are defined according to a logical product of design rules in regions in which functional blocks are formed and wiring regions. Hence, the pitches of the wiring channel grid must be made narrower with the progress of miniaturization.

Meanwhile, in the technical field of the semiconductor integrated circuit, development of the LSI is entering the region called deep submicron generation or sub-quartermicron generation according to the progress of fine pattern techniques. In these generations, harmful influences due to miniaturization have become dominant. For example, it has become an issue that, according to miniaturization of the power supply metal wiring, generation of electromigration and/or source voltage drop of the transistors due to resistance of wiring material exert harmful influences upon an operation of the device. For this reason, the advance of miniaturization of the line width of the metal wiring has been slowed down after the middle of the 1980s compared to miniaturization of the gate length of the transistor. In addition, since contact resistance is increased because of miniaturization of the area of the contact hole, source voltage drop of the transistors has also been caused to thus exert harmful influences upon an operation speed of the device.

For the above reasons, it may be supposed that the line width of the power supply metal wiring is restricted to technological limits such as almost 0.3 to 0.5 $\mu$m because of resistance value of material unless a room-temperature superconducting wiring is employed, and therefore it appears that miniaturization of the power supply metal wiring is at a critical stage. In particular, it has been said that miniaturization can be improved at most to the $\frac{2}{3}$ extent of the present miniaturization even if Ag, Au, Cu, etc. whose resistance values are lower than Al being mainly used at present are employed. In other words, it is possible that wirings other than the power supply metal wiring can be further miniaturized, but it has become difficult to improve the integration density by using the conventional wiring channel grid having uniform pitches since the line width of the power supply metal wiring, etc. determine the design rule.

In the case that the pitches of the wiring channel grid are designed, two cases may be considered if classified broadly.

(i) One case is that only the design rule for the wiring process, i.e., wiring width and wiring interval, contact hole size and contact hole interval, via hole contact size and via hole contact interval in the multilevel wirings, etc. must be considered.

(ii) The other case is that design rules in fabrication stages prior to the wiring process must be considered. Namely, design rule for manufacturing process of the basic cell (basic cell process) in addition to the design rule for the wiring process must be considered to design the pitches of the wiring channel grid. In the following, early processes such as oxidation, CVD, ion implantation, RIE, etc. performed until the interlayer insulating film just under the bottom metal layer are formed, including patterning of the gate polysilicon of the basic cell, will be called "basic cell process". And the process after forming the interlayer insulating film, such as opening the contact holes in the interlayer insulating film and patterning the wiring layers will be called wiring process".

In the layout of the gate basic cell shown in FIG. 1A, only the design rule for the wiring process should be regarded in order to define pitches of the lines X1-X2-X3-X4, X7-X8-X9-X10 constituting the wiring channel grid. This corresponds to the case (i). In contrast, the design rules for contact margin allocated to the polysilicon regions 11, intervals between the polysilicon regions 11 and the source/drain regions 12, 14, and contact margin allocated to the source/drain regions 12, 14 should also be regarded in order to define the pitches of the lines X0-X1, X4-X5, X6-X7, X10-X11 constituting the wiring channel grid. This corresponds to the case (ii). Similarly, the design rules for contact margin allocated to the polysilicon regions 11 and intervals between the polysilicon regions 11 should be regarded in order to define the pitches of the lines X5-X6, X11-X0 constituting the wiring channel grid. Further, in order to define the pitches of two sets of lines Y0-Y1-Y2, Y4-Y5-Y6, the design rule for contact margin allocated to the gate polysilicon regions 11 or intervals between the contact holes for the source/drain regions 12, 14 and the narrowest portion of the polysilicon region defining a gate length of the MOSFET should be regarded in addition to the design rule for the wiring process. In order to define the pitches of a set of lines Y2-Y3-Y4, the design rule for intervals between the source/drain regions 12, 14 and the substrate/contact regions 4a, 4b in addition to the design rule for the wiring process should be regarded. Still further, in order to define the pitches of a set of lines Y6-Y0 with taking the wiring channel grid Y0 in the adjacent block into account, the design rule for intervals between respective source/drain regions 14, 12 in the adjacent block in addition to the design rule for the wiring process should be regarded. These correspond to the above case (ii).

In general, the design rule for the basic cell process is hard to be miniaturized compared to the design rule for the wiring process because the separation between the gate polysilicon regions, contact margin, etc. must be taken in account. In other words, the pitches of plural sets of vertical lines X0-X1, X4-X5, X5-X6, X6-X7, X10-X11, X11-X0, and the pitches of lateral lines intersecting with these vertical lines and constituting the wiring channel grid are prescribed by the design rule for the basic cell process. And these pitches must be designed wider than the pitches of two sets of lines X1-X2-X3-X4, X7-X8-X9-X10 prescribed only by the design rules for the wiring process. Hence, if the pitches of the wiring channel grid are defined uniformly, the design rule should be indispensably defined based on the largest pitch of the wiring channel grid.

In the current semiconductor manufacturing technology, a difference between the design rule for the wiring process and the design rule for the basic cell process becomes conspicuous. More particularly, the pitches of two sets of lines X1-X2-X3-X4, X7-X8-X9-X10 constituting the wiring channel grid can be made narrow, nevertheless the pitches of two sets of lines Y0-Y1-Y2, Y4-Y5-Y6, to which the most severe design rule is applied, cannot be made narrow.

After all, as the pitches of the wiring channel grid are defined uniformly, the pitches of two sets of lines X1-X2-X3-X4, X7-X8-X9-X10 constituting the wiring channel grid are still maintained large as they are, whereby preventing an improvement of the integration density.

As explained earlier, in the prior art wherein the pitches of the wiring channel grid are set uniformly, there is the problem that the difference between the design rule for the wiring process and the design rule for the basic cell process has become remarkable so that the integration density has not been able to enhanced. Except for the problem attributable to the difference between the design rules, the power supply wirings and the large current signal wirings have also to be made narrow if the pitches of the wiring channel grid are uniformly made narrow.

Therefore, such problems have arisen that source voltage drop due to the wiring resistance, wiring defect caused by electromigration, etc. occur and disadvantages such as malfunction, reduction in operation speed, etc. are caused.

SUMMARY OF THE INVENTION

Therefore, the present invention has been made in view of the above problems and it is an object of the present invention to provide a semiconductor integrated circuit capable of improving a pitch design of a wiring channel grid by selecting a wiring width according to type of the wiring to be formed so as to improve the integration density without deteriorating characteristics of the circuit operation.

It is another object of the present invention to provide a semiconductor integrated circuit capable of reducing a useless occupied area to proceed miniaturization much more even under the existence of gap between a design rule of wiring process and a design rule of basic cell process.

It is still another object of the present invention to provide a semiconductor integrated circuit capable of suppressing generation of electromigration and also improving its integration density.

It is yet still another object of the present invention to provide a semiconductor integrated circuit capable of improving integration density without reduction in power supply voltage.

It is further object of the present invention to provide a pattern design method for an integrated circuit capable of improving integrated density readily while maintaining sufficient circuit characteristics.

To this end, in the present invention, pitches of the wiring channel grid are not defined uniformly, and the pitches are determined non-uniformly in the wiring channel grid corresponding to the interconnections in respective levels so as to optimize the pitches in respective regions in the circuit. More particularly, the semiconductor integrated circuit is formed according to the master slice layout in which plural gate basic cells are arranged on the semiconductor chip and the gate basic cells are connected by the interconnections arranged along the channel grid prescribed on the gate basic cells, and it is the first feature that the wiring channel grid is defined by non-uniform pitches. "Non-uniform pitches" means that horizontal (lateral) lines which are composed of first set of horizontal lines having a first spacing and second set of horizontal lines having a second spacing and perpendicular (vertical) lines are arranged orthogonally in the wiring channel grid. The perpendicular line may also be composed of lines having a third spacing and lines having a fourth spacing. The spacings are not limited to two kinds in lateral or vertical line. Lines having three kinds of spacings or more may be employed in either of the lateral and vertical directions.

It is preferable that, while maintaining the pitches of the wiring channel grid on which higher potential power supply wirings and lower potential power supply wirings are provided at a preselected value, the pitches of the wiring channel grid on which wirings other than the higher and the lower potential power supply wirings are provided to have as narrower widths as possible than the preselected value. In this case, it is also preferable that the higher potential power supply wirings and the lower potential power supply wirings have a wiring width in which plural minimum contact holes or contact holes having an area corresponding to the plural minimum contact holes can be provided.

According to the first aspect of the present invention, by defining the wiring channel grid by non-uniform pitches, improvement of the integration density by virtue of miniaturization can be achieved while keeping widths of the particular wirings at preselected wide values. Therefore, the current density can be assured less than a certain value and the generation of electromigration can be suppressed and therefore the semiconductor integrated circuit with high reliability can be provided. Further, the semiconductor integrated circuit can be provided in which the problems of the power supply voltage drop due to wiring resistance, the existence of parasitic resistance due to increase in the contact resistance ascribable to miniaturization of the contact holes, etc. can be suppressed. Thus the reduction in operation speed of the device can be suppressed.

In the first aspect of the present invention, flip arrangement can be realized easily if the mutually orthogonal lines constituting the wiring channel grid which is defined by the non-uniform pitches are arranged symmetrically in the X or Y direction of the gate basic cell. In addition, the higher and the lower potential power supply wirings may be arranged such that center lines of the power supply wirings are shifted with respect to the wiring channel grid. Otherwise, the grid having wider pitches may be employed as the wiring channel grid for the special signal wirings other than the higher and the lower potential power supply wirings. Where "special signal wirings" means signal wirings in which low resistance, large current characteristics, etc. are requested such as wirings for clock signal and analogue signal. Furthermore, the wiring channel grid of the present invention having wider pitches may be used as the wiring area in which plural interconnections are disposed, if it is used as another wiring channel region other than the higher and the lower potential power supply wirings.

The second aspect of the present invention is that a plurality of gate basic cells are arranged on a semiconductor chip so that a plurality of functional blocks are disposed on the gate basic cells, and the interconnections between the functional blocks and the wiring on the functional blocks are provided along a wiring channel grid having a non-uniform pitches. These functional blocks are connected through the interconnections along the non-uniform wiring channel grid. The semiconductor integrated circuit designed by the master slice layout method in which desired logic circuits are be composed only by means of modification of the wiring process based upon the non-uniform grid is provided.

According to the second aspect of the present invention, the semiconductor integrated circuit can be provided in which other wirings may be made narrow while keeping the wide widths of the particular wirings such as power supply wirings and special signal wirings by defining the wiring channel grid by means of non-uniform pitches. Further, the high integration density may be achieved by increasing the number of interconnections between a couple of lines constituting the wiring channel grid. Since the widths of the particular interconnections are formed wide, electromigration and power supply voltage drop can be suppressed. Hence, the high speed semiconductor integrated circuit with low power dissipation can be designed simply and manufactured in a short time.

The third aspect of the present invention lies in a master slice design method for the semiconductor integrated circuit in which patterns of a plurality of gate basic cells are arranged on a semiconductor chip, then the wiring channel grid having non-uniform pitches is defined on the patterns of the bate basic cells, and then the patterns of the interconnections are arranged along the wiring channel grid to constitute a logical functional block.

According to the third aspect of the present invention, since the wiring channel grid is defined by the non-uniform pitches, only the widths of the particular interconnections such as power supply wiring and clock signal wiring can be formed wide. And also the number of the interconnections can be easily increased in the particular locations or region between a couple of lines constituting the wiring grid. Accordingly, the wiring layout with high integration density can be designed in a short time and at low cost. In other words, the semiconductor integrated circuit can be designed easily in a short time which can satisfy simultaneously both requirements of a high packing density and a wide wiring width so as to suppress the electromigration, power supply voltage drop. Hence, without reducing an operation speed of the integrated circuit such as LSI, high integration density is obtained.

The fourth aspect of the present invention lies in a master slice layout method in which a plurality of gate basic cells are arranged on a semiconductor chip, then a plurality of functional blocks are arranged on the gate basic cells, then the wiring regions defined by a wiring channel grid having non-uniform pitches are provided between the functional blocks and on the functional blocks, and then arranged functional blocks are connected by interconnections disposed along the wiring channel grid. In the master slice design method of fourth aspect, the semiconductor integrated circuit can be provided in which desired logic circuits are be composed only by means of modification of the wiring process along a wiring channel grid formed on the gate basic cells, and the wiring channel grid is defined by non-uniform pitches.

According to the fourth aspect of the present invention, since the wide widths of the power supply wirings and the special signal wirings can be maintained and other interconnections may be made narrow by defining the wiring channel grid so as to have non-uniform pitches. Further, according to the fourth aspect, it becomes easy to increase the number of the interconnections between and/or along a couple of lines constituting the grid. Hence, the wiring layout of the semiconductor integrated circuit with high integration density can be designed at low cost and in a short time. In addition, the semiconductor integrated circuit can be designed simply and in a short time which can satisfy simultaneously trade-off requirements between the feature size reduction and the maintenance of wide wiring width so as to prevent electromigration and drop of power supply voltage, these are due to the wiring resistance and the contact resistance.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

BRIEF DESCRIPTION OF THE DRAWINGS

FIG. 2A is a schematic plan view showing layout patterns of gate basic cells in a semiconductor integrated circuit according to a first embodiment of the present invention together with a wiring channel grid;

DETAILED DESCRIPTION OF THE EMBODIMENTS

Figure 1A:
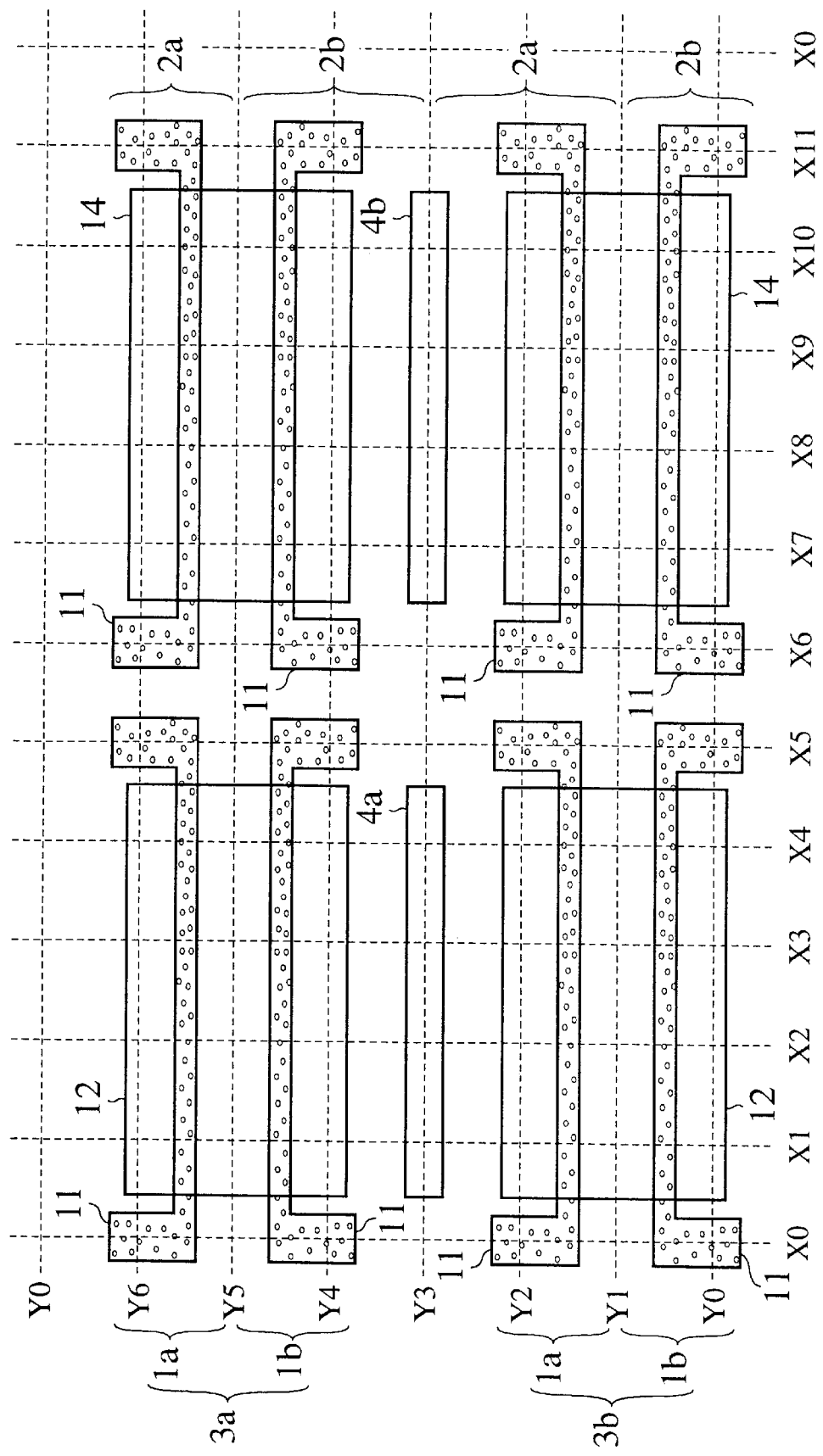
FIG. 1A is a schematic plan view showing a part of layout patterns of a conventional semiconductor integrated circuit wherein a wiring channel grid is arranged on gate basic cells.
Figure 1B:
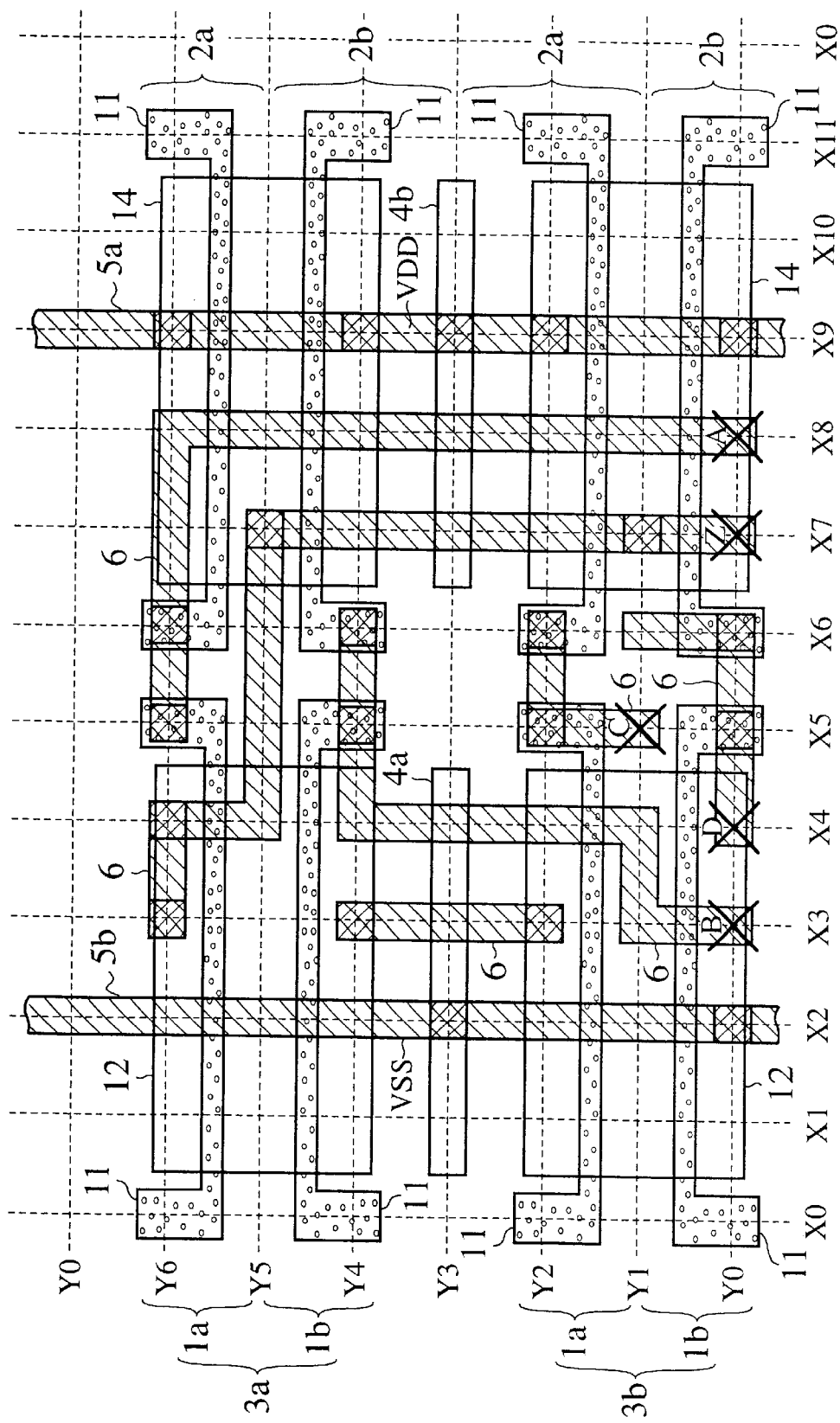
FIG. 1B is a schematic plan view showing layout patterns of a functional block composed of arranging metal wiring layers on the configuration shown in FIG. 1A.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

(First Embodiment)

Figure 2B:
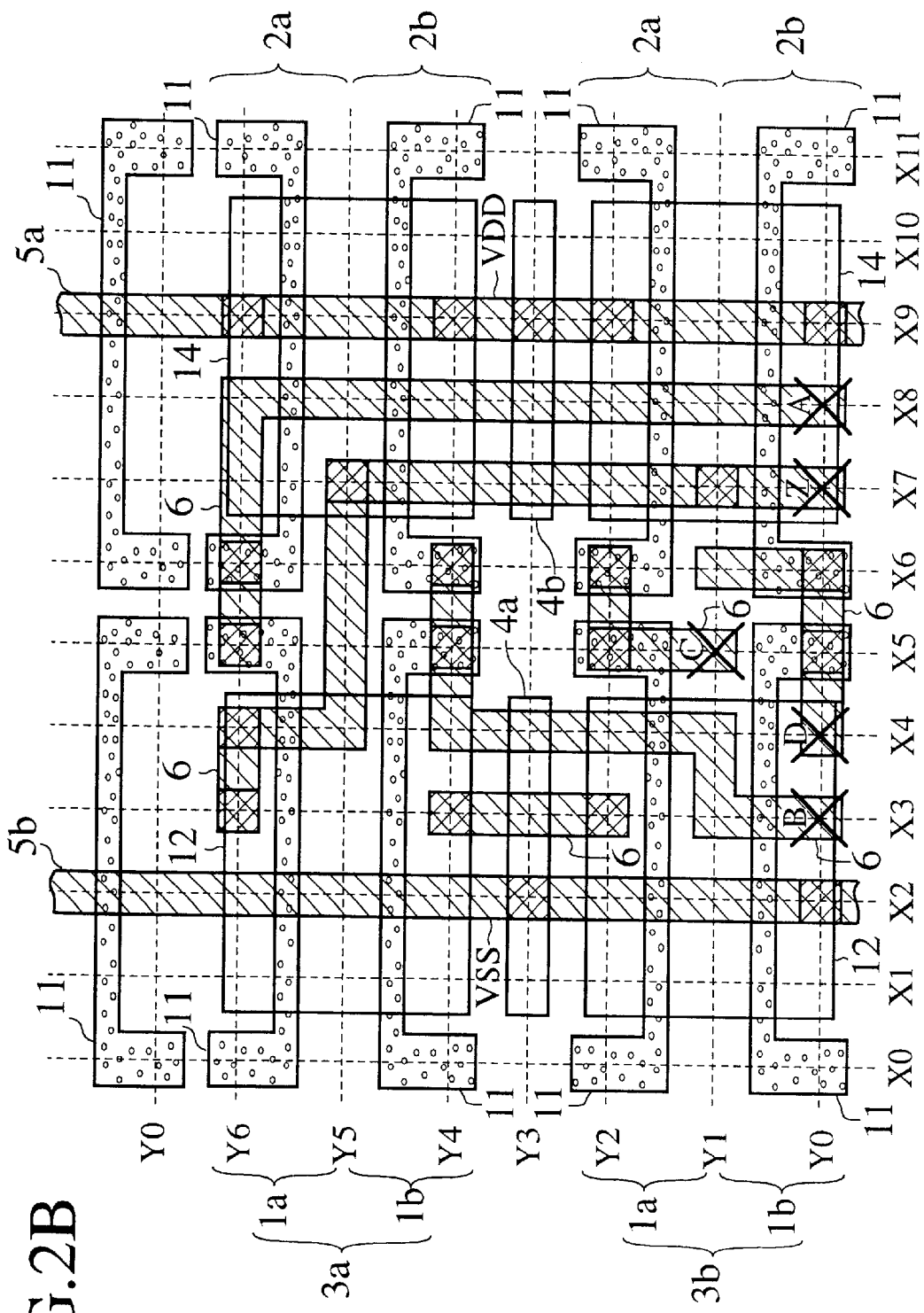
FIG. 2B is a schematic plan view showing layout patterns of a functional block in which metal wiring layers are arranged on the configuration shown in FIG. 2A.
Figure 2C:
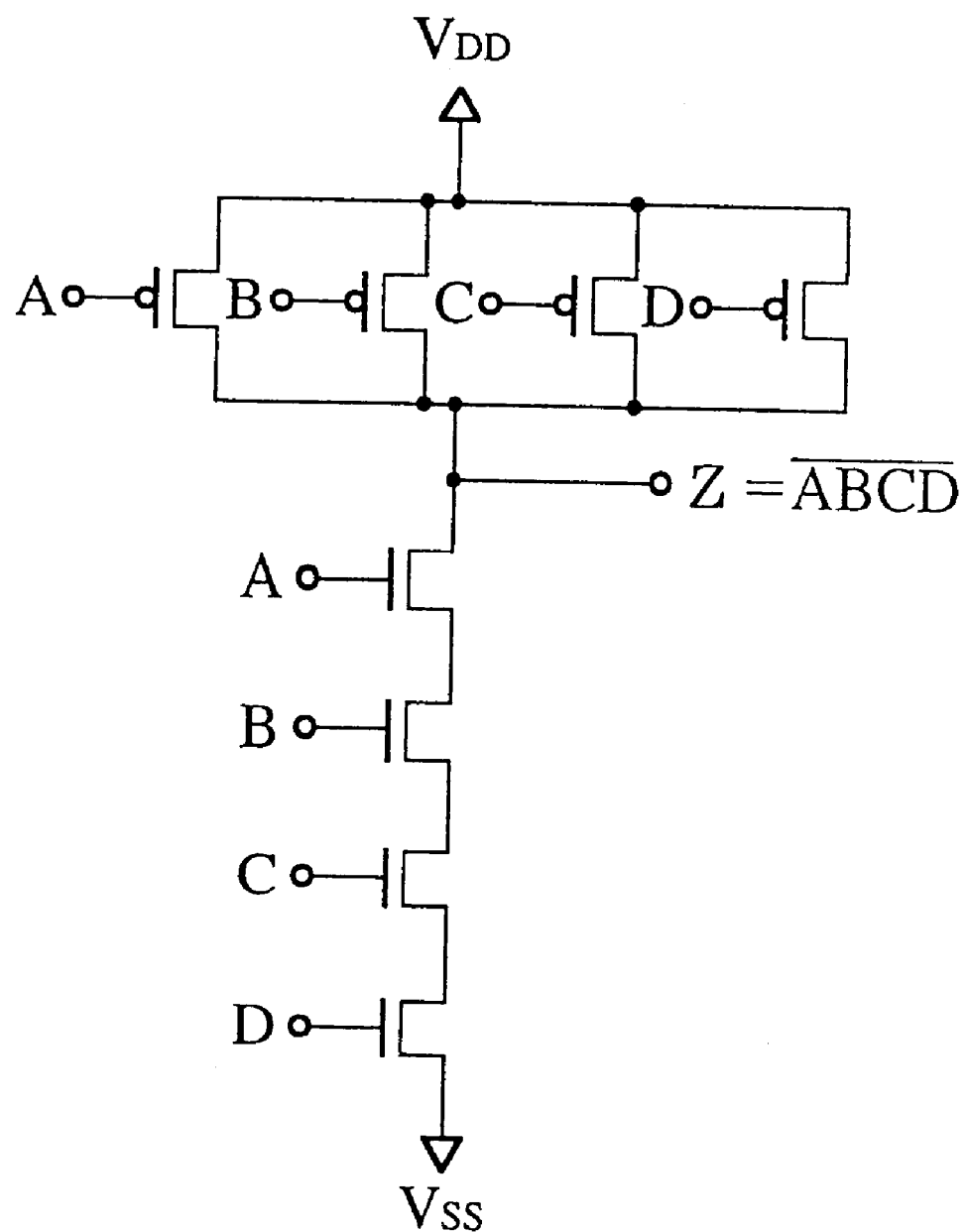
FIG. 2C is a circuit diagram showing an equivalent circuit of the functional block (four-input NAND gate) shown in FIG. 2B.

FIGS. 2A to 2D are views showing a configuration of a semiconductor integrated circuit according to a first embodiment of the present invention. FIG. 2A is a view showing layout patterns of gate basic cells, as being similar to FIG. 1A. In FIG. 2A, like references refer to like parts in FIG. 1A. A key feature of the layout shown in FIG. 2A is that, while maintaining spacings between horizontal lines Y0-Y1-Y2 and lines Y4-Y5-Y6 constituting the wiring channel grid at a predetermined (relatively wide) value, spacings of other lines in a wiring channel grid are made narrow rather than the predetermined value in order to satisfy the design rules for a spacing between a gate polysilicon region 11 and a contact hole formed on source/drain regions. This is because the scaling of the spacing between the contact hole and the polysilicon region is severe, i.e., the feature size reduction is difficult. The pitch interval which is used in the prior art may be employed as the predetermined value, for example. For the pitches of such wiring channel grid, a layout pattern of a four-input NAND gate is constructed as shown in FIG. 2B. The four-input NAND gate of the present invention employs four input terminals A, B, C, and D. Namely, four end portions of the metal wirings (signal wirings) corresponding to perpendicular lines X8, X3, X5, X4 represent input terminals A, B, C, D, respectively. The input terminal A is connected to a gate polysilicon regions 11 of an n-MOS 1a and a p-MOS 2a constituting a gate basic cell 3a. The input terminal B is connected to the gate polysilicon regions 11 of an n-MOS 1b and a p-MOS 2b constituting the gate basic cell 3a. The input terminal C is connected to the gate polysilicon regions 11 of the n-MOS 1a and the p-MOS 2a constituting the gate basic cell 3b. The input terminal D is connected to the gate polysilicon regions 11 of the n-MOS 1b and the p-MOS 2b constituting the gate basic cell 3b. A higher potential (VDD) power supply wiring 5a is provided along the line X9 to be connected to a source region 14 of the p-MOSs 2a, 2b in an n-well and to a substrate/contact region 4b, so that four p-MOSs are connected in parallel. A lower potential (VSS) power supply wiring 5a is provided along the line X2 and connected to a source region 12 of the n-MOS 1b in a p-well and the substrate/contact region 4a. An end portion of the signal wiring along the X7 serves as an output terminal Z. The output terminal Z is in turn connected to respective drain regions 14 of four p-MOSs 2a, 2b and the source region 12 of one n-MOS 1a. Four n-MOSs 1a, 1b are connected in serial with each other by virtue of a wiring 6 provided along the line X3. An equivalent circuit of the four-input NAND gate shown in FIG. 2B is represented in FIG. 2C. Input terminals A, B, C, D are connected by predetermined interconnections to the functional block in the preceding stage, and the output terminal Z is connected by a predetermined interconnection to the functional block in the succeeding stage. In addition, the higher potential power supply wiring 5a and the lower potential power supply wiring 5b are extended as common power supply wirings over other functional blocks, though not shown.

Figure 2D:
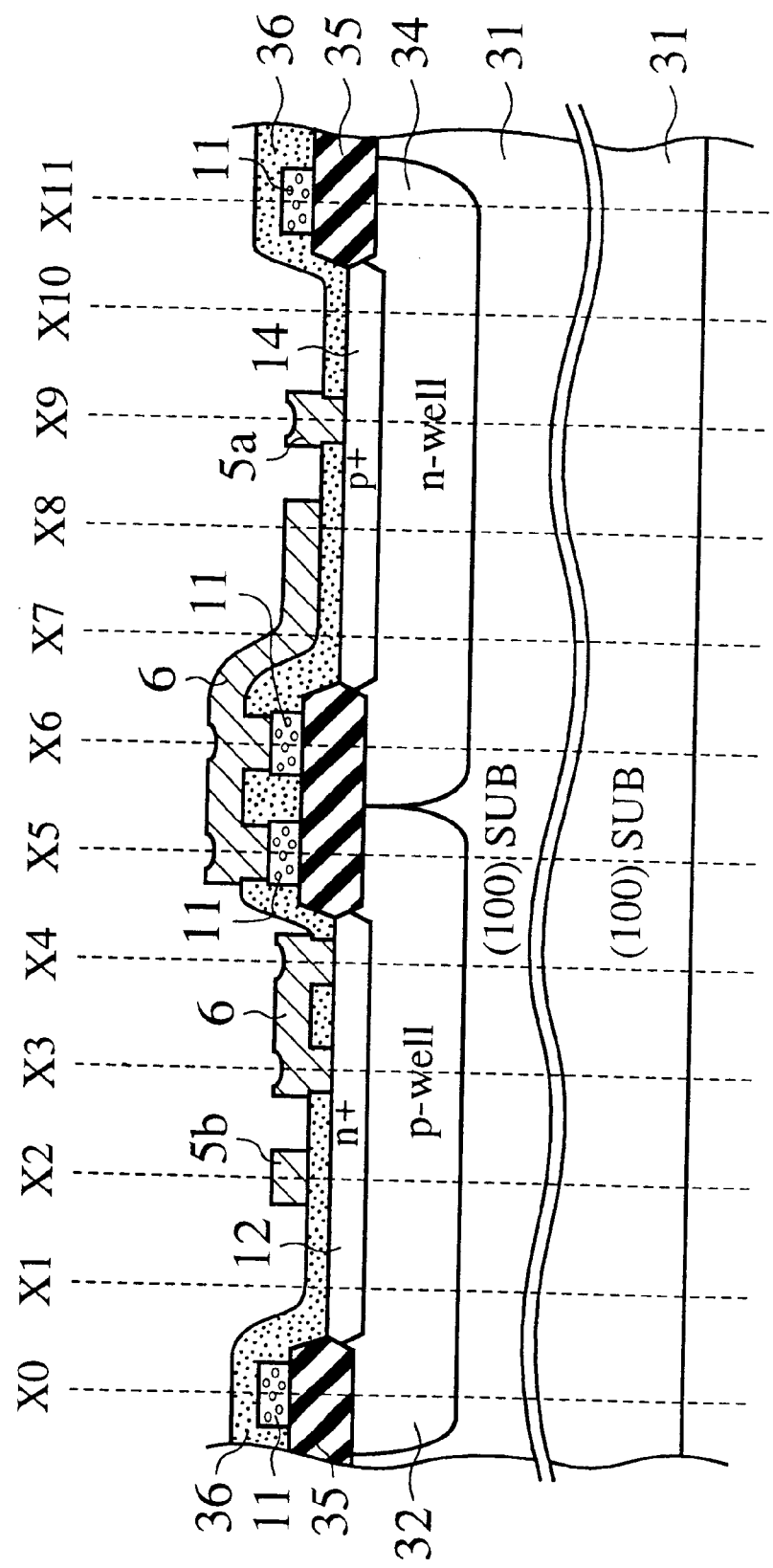
FIG. 2D is a sectional view, taken along the Y6 direction on the functional block shown in FIG. 2B.

FIG. 2D is a sectional view showing the functional block along the line Y6 constituting the wiring channel grid in FIG. 2B. As shown in FIG. 2D, a p-well 32 and an n-well 34 are formed on a silicon (100) substrate 31. Transistor regions are isolated by field oxide films 35. An $n^+$ diffusion layer 12 serving as source/drain regions of the n-MOS and a $p^+$ diffusion layer 14 serving as source/drain regions of the p-MOS are formed in the window portions of the field oxide films 35. The gate polysilicon regions 11 are formed on the field oxide films 35. The gate polysilicon regions 11 are formed so as to extend from the regions located on the gate oxide film, though not shown. Interlayer insulating films 36 such as $SiO_2$ film, PSG film, BPSG film, etc. are deposited on the gate polysilicon regions 11, $n^+$ diffusion layer 12 and $p^+$ diffusion layer 14. The higher potential (VDD) power supply wiring 5a, the lower potential (VSS) power supply wiring 5b, the signal wiring 6 which are made of Al, Al—Si, Al—Cu—Si, etc. are formed on the interlayer insulating films 36. These wirings are electrically connected to the source/drain regions 12, 14 and the gate polysilicon regions 11 via predetermined contact holes.

In the first embodiment, plural perpendicular (vertical) lines X0 to X11 constituting the wiring channel grid are arranged at an equal spacing, but plural horizontal (lateral) lines have two types of spacings. In other words, the lateral lines consist of a first set of lines having a first spacing for defining distances between lines Y0-Y1-Y2 and Y4-Y5-Y6 and a second set of lines having a second spacing, which being narrower than the first spacing, for defining distances between lines Y2-Y3-Y4 and Y6-Y0. In FIG. 2B, since the lines X0-X11 and lines Y2-Y4 constituting the wiring channel grid in the vertical and lateral directions are arranged to have narrower pitches than the prior art, an area for forming gate basic cells can be reduced in both vertical and lateral directions to thus improve the integration density by 20 to 50% compared to the conventional layout in which the pitches of the wiring channel grid are uniformly defined. In other words, the integration density of LSI in sub-quartermicron generation in which difference between the design rules for the wiring process and the basic cell process become dominant can be improved, and the design of such LSI can be facilitated.

(Second Embodiment)

Figure 3A:
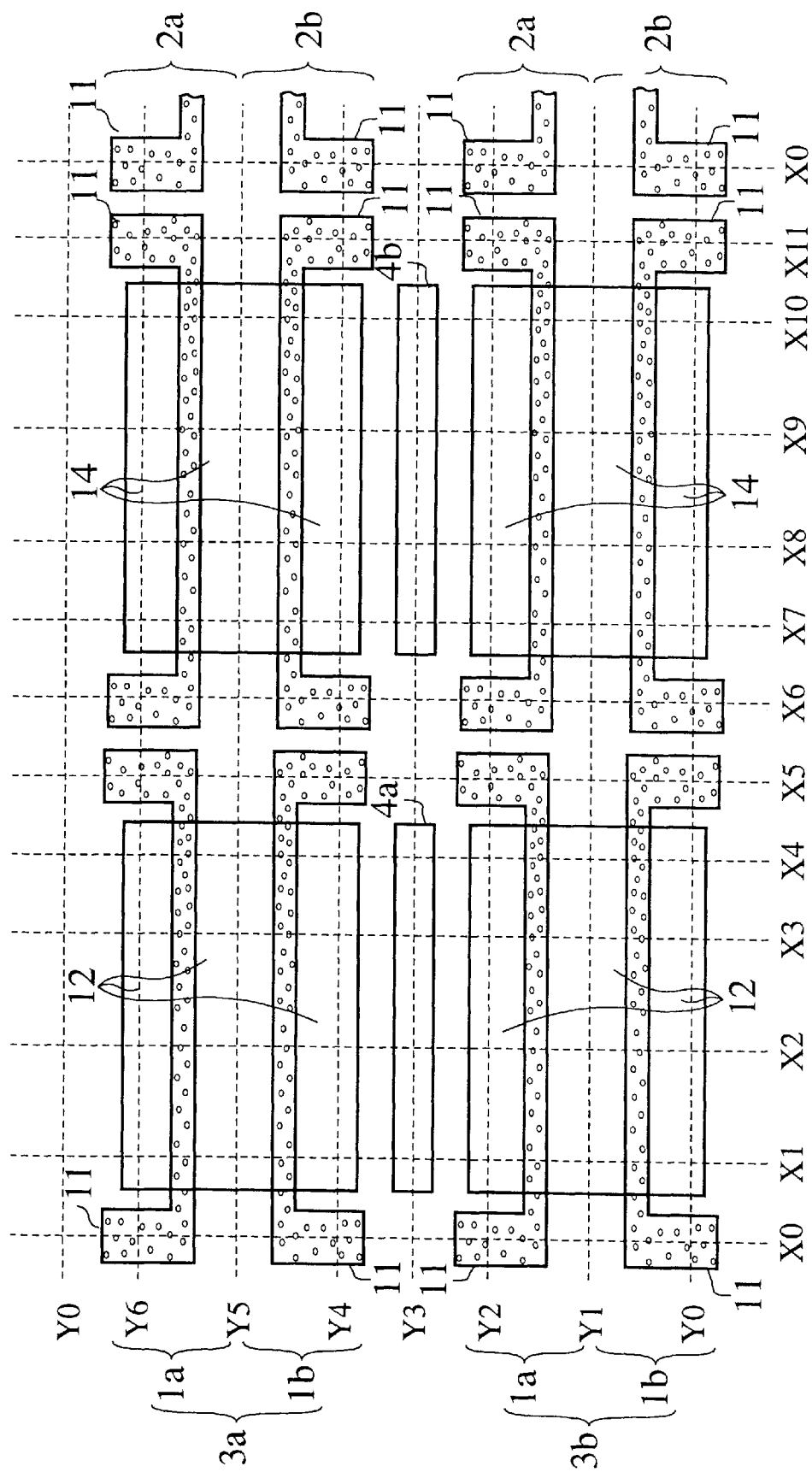
FIG. 3A is a schematic plan view showing layout patterns of gate basic cells in a semiconductor integrated circuit according to a second embodiment of the present invention together with a wiring channel grid.
Figure 3B:
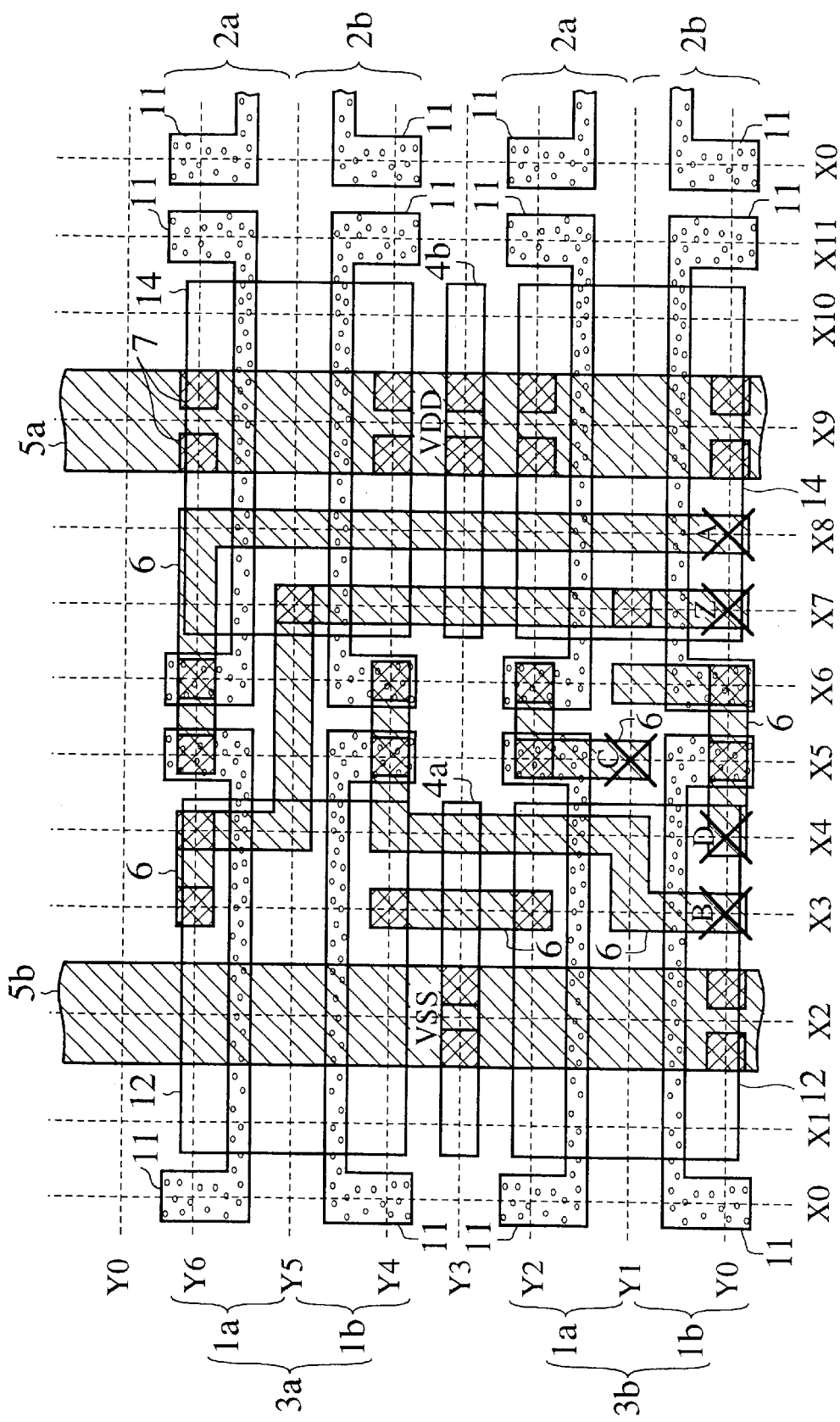
FIG. 3B is a schematic plan view showing layout patterns of a functional block in which metal wiring layers are arranged on the configuration shown in FIG. 3A.
Figure 3C:
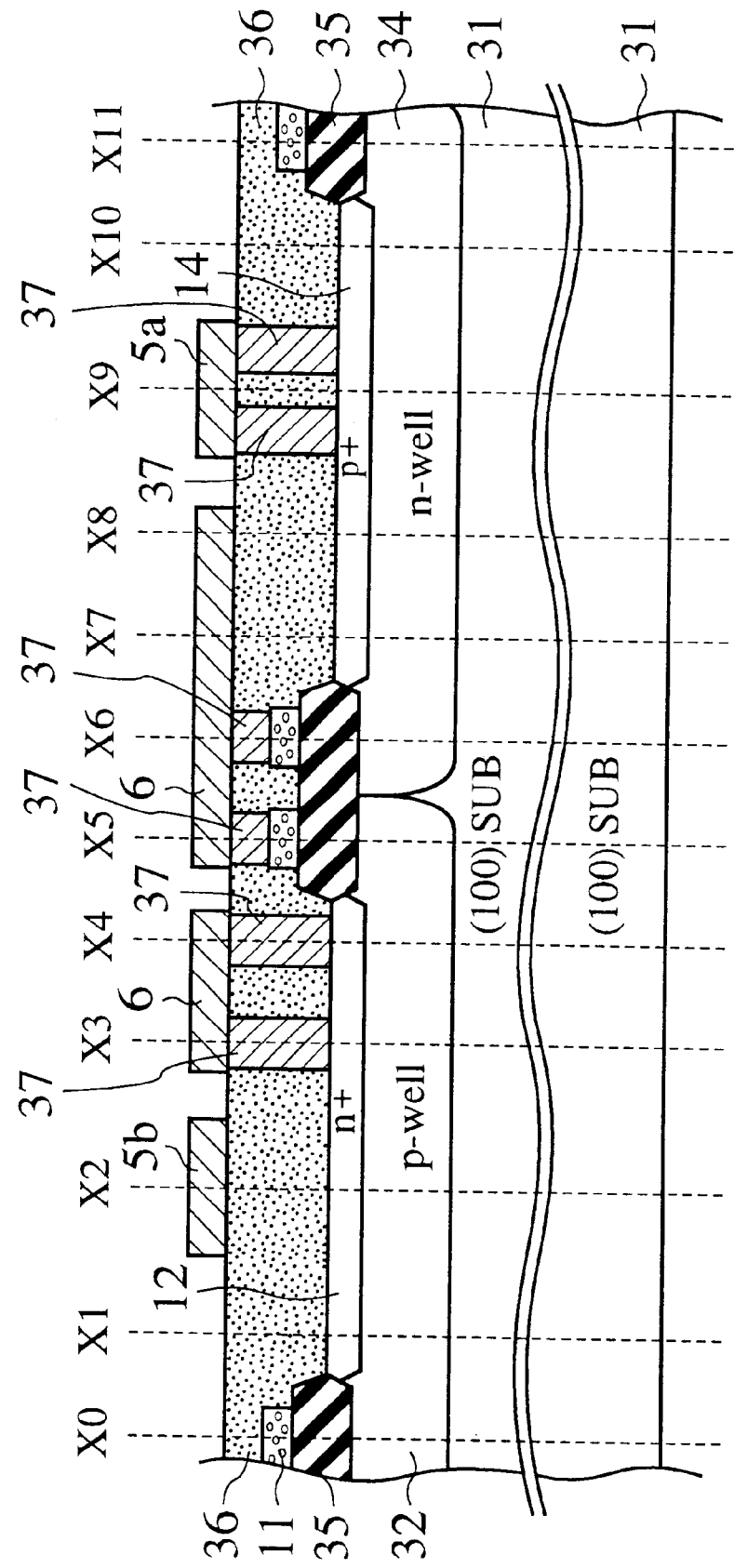
FIG. 3C is a sectional view, taken along the Y6 direction on the layout patterns shown in FIG. 3B.

FIGS. 3A to 3C are views showing a configuration of a semiconductor integrated circuit according to a second embodiment of the present invention. A key feature of a semiconductor integrated circuit shown in FIG. 3A is that spacings between perpendicular (vertical) lines X1-X2-X3, X8-X9-X10 constituting the wiring channel grid are settled wide rather than the layout shown in FIG. 2A. In other words, in the second embodiment of the present invention, a group of horizontal (lateral) lines consist of a first set of lines Y0-Y2, Y4-Y6 having a first spacing and a second set of lines Y2-Y4, Y6-Y0 having a second spacing which being narrower than the first spacing, and a group of vertical lines consist of a third set of lines X1-X3, X8-X10 having a third spacing and a fourth set of lines X0-X1, X3-X8, X10-X11-X0 having a fourth spacing. The third spacing is made wider than the fourth spacing. Hence, as shown in FIG. 3B, a VSS (lower potential) power supply wiring 5b formed along the line X2 and a VDD (higher potential) power supply wiring 5a formed along the line X9 can be formed wide to such an extent that two minimum size contact holes 7, for example, can be arranged along the wiring width direction (lateral direction). The contact holes used for the power supply wirings 5a, 5b can be set arbitrarily as design matters in number and size.

FIG. 3C is a sectional view taken along the line Y6 constituting the wiring channel grid in FIG. 3B. As shown in FIG. 3C, a p-well 32 and an n-well 34 are formed on a silicon (100) substrate 31. Transistor regions are defined by a field oxide film 35. An $n^+$ diffusion layer 12 serving as source/drain regions of an n-MOS and a $p^+$ diffusion layer 14 serving as source/drain regions of a p-MOS are formed in the window portions of the field oxide film 35. Gate polysilicon regions 11 extended from upper surfaces of the gate oxide films, though not shown, are formed on the field oxide film 35. An interlayer insulating film 36 such as $SiO_2$ film, PSG film, BPSG film is then deposited on an overall surface of a resultant structure. An upper surface of the interlayer insulating film 36 is planalized by virtue of CMP (Chemical Mechanical Polishing), or the like. The higher potential (VDD) power supply wiring 5a, the lower potential (VSS) power supply wiring 5b, and the signal wirings 6, all being made of Al, Al—Si, Al—Cu—Si, etc., are then formed on the interlayer insulating film 36. These wirings are electrically connected to the source/drain regions 12, 14 and the gate polysilicon regions 11 via plug electrodes 37 made of doped-polysilicon, W, Ti, $WSi_2$, etc. which are buried in the contact holes.

As shown in FIGS. 3B and 3C, the width of the power supply wirings can be made wider by setting pitches of the wiring channel grid in the power supply wiring forming regions wider than those in other regions, so that reduction in the power supply voltage and electromigration due to increase in wiring resistance can be prevented. In addition, since a total area of the source contact holes can be made large, source contact resistance can be reduced and also improvement in the operation speed can be obtained.

In the second embodiment of the present invention, the spacings of the lines Y0-Y2, Y4-Y6 constituting the wiring channel grid are set to the first spacing, the spacings of the lines X1-X3, X8-X10 corresponding to the power supply wirings are set to the third spacing to assure a relatively wide spacing, and the spacings of remaining wirings are set as narrow as possible (second and fourth spacings). Therefore, the width of the power supply wiring can be extended and the width of the signal wiring can be made narrow. As a result, an chip area for LSI can be reduced in contrast to the prior art wherein the pitches of the wiring channel grid are uniformly fixed, and the patterns in the preselected portions can also be miniaturized. A solution of disadvantageous problems, which are brought about due to narrow wiring width and are difficult to overcome in the prior art, and an improvement of the integration density can be satisfied simultaneously. Accordingly, a breakthrough in the progress of integration density of the LSI whose feature sizes are becoming smaller and smaller from sub-quartermicron to the nano meter order can be achieved. That is, the present invention is able to refute such a baffling hypothesis that although the gate length can be made less than 0.1 $\mu$m in the basic cell process, the wiring line width is limited to about 0.3 to 0.5 $\mu$m because of the increasement of wiring resistance determined by the wiring meterials. According to the second embodiment of the present invention, as for the width of the signal line in which problems such as increase in wiring resistance do not have significant effect on device performance, the wiring line width of 0.3 $\mu$m to 0.1 $\mu$m or less can be easily accomplished.

Figure 4A:
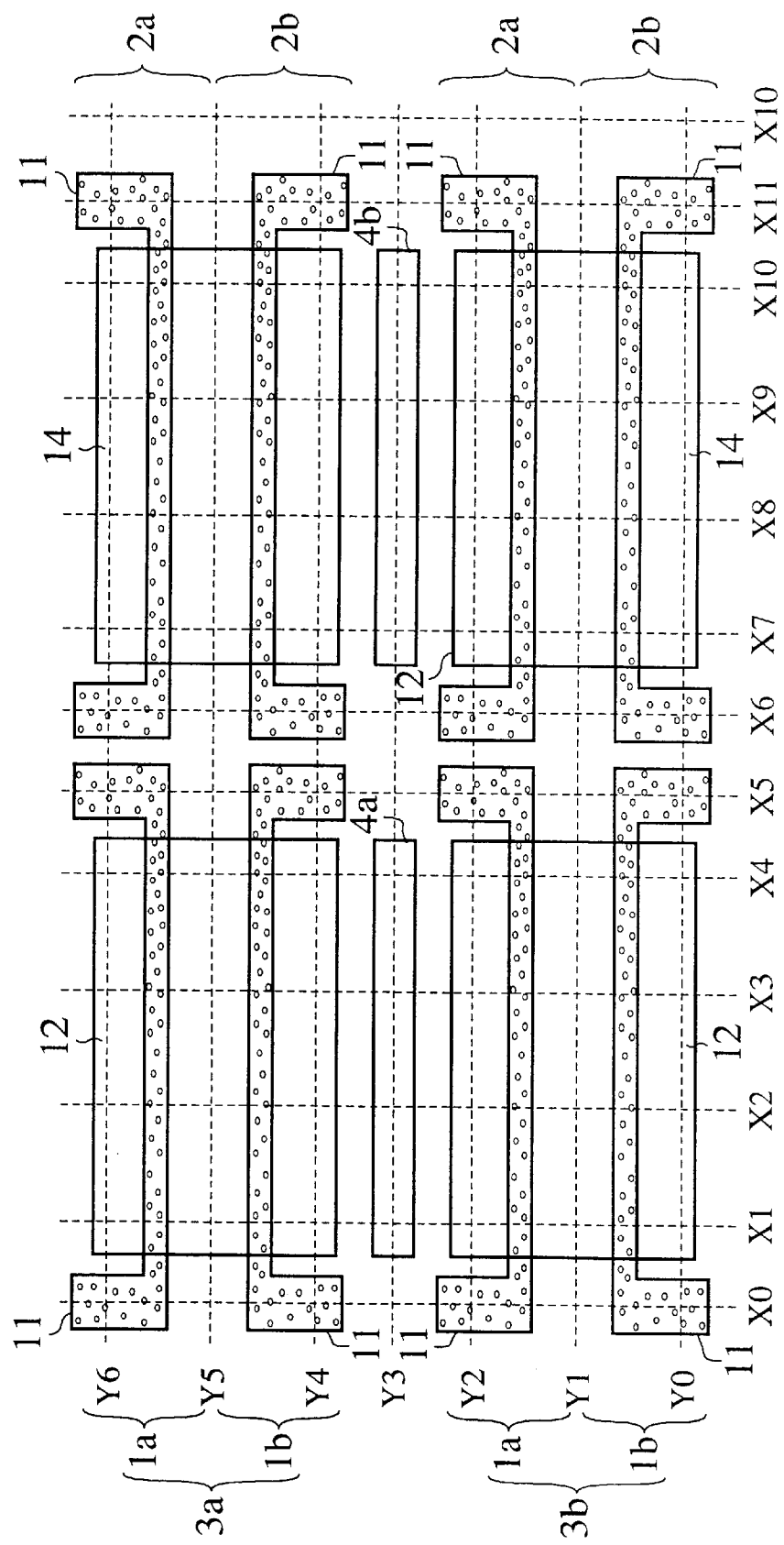
FIG. 4A is a schematic plan view showing layout patterns of gate basic cells in a semiconductor integrated circuit according to a modification of the second embodiment of the present invention together with a wiring channel grid.
Figure 4B:
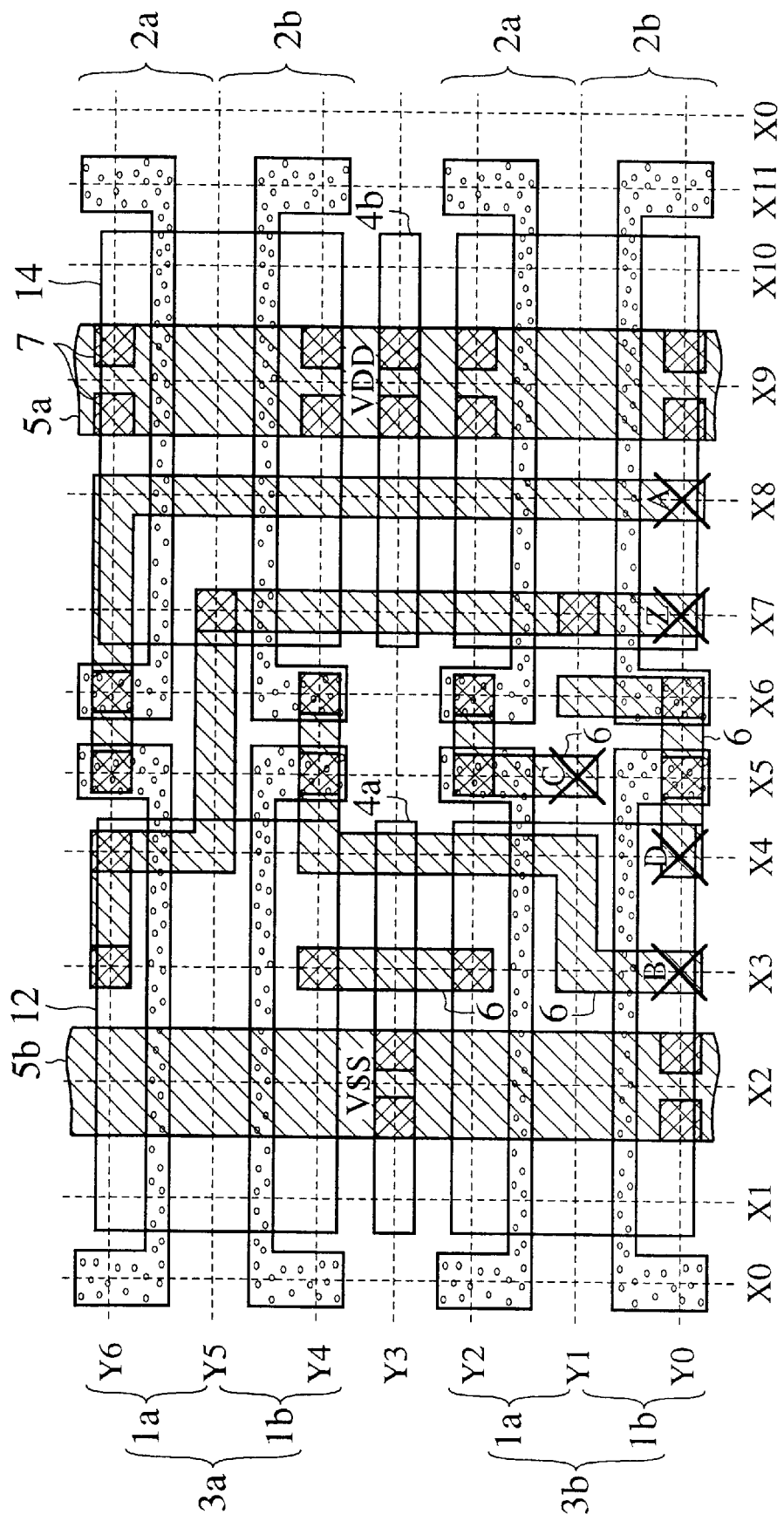
FIG. 4B is a schematic plan view showing layout patterns of a functional block in which metal wiring layers are arranged on the configuration shown in FIG. 4A.
Figure 4C:
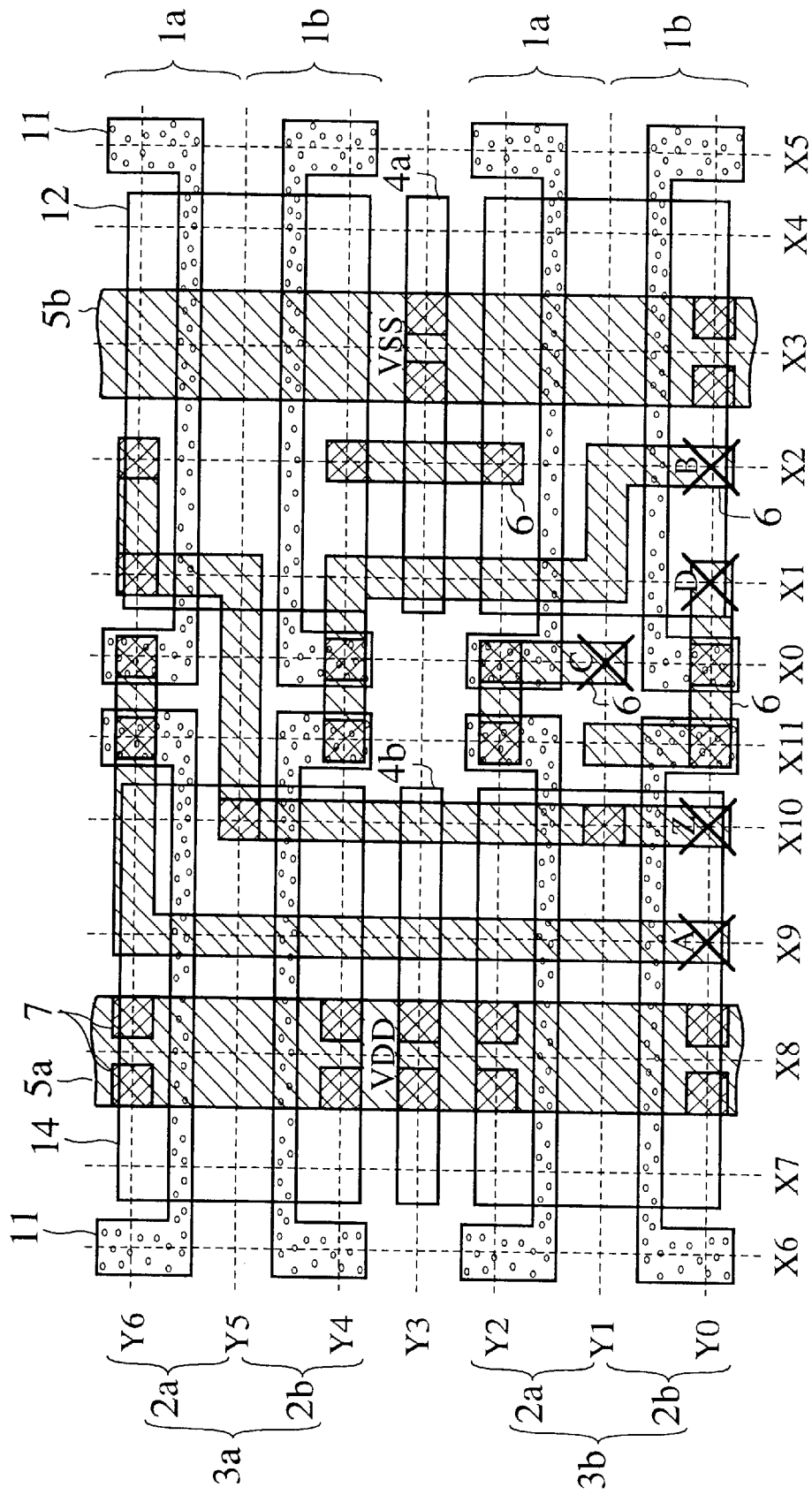
FIG. 4C is a schematic plan view showing layout patterns of the functional block in which the configuration in FIG. 4B is flip-arranged.

FIGS. 4A to 4C are views showing a configuration of a semiconductor integrated circuit according to a modification of the second embodiment of the present invention. A key feature of a layout of the gate basic cells shown in FIG. 4A is that spacings between the lines X3-X4, X7-X8 constituting the wiring channel grid are set wider than those shown in FIG. 3A, i.e., set to the third spacing which is equal to the spacings between the lines X1-X2-X3, X8-X9-X10 so as to provide a symmetry in the X direction, whereas spacings between the lines X0-X1, X4-X7, X10-X11-X0 are set to a narrow fourth spacing. Along the symmetrical wiring channel grid, a four-input NAND gate can be disposed as shown in FIG. 4B can be constituted. In this manner, the layout of the gate shown in FIG. 4C, which is a flip arrangement of FIG. 4B, can be easily accomplished by layouting along the symmetrical vertical lines constituting the wiring channel grid, and therefore such layout is advantageous to constitute desired logic circuits having a plurality of gate basic cells successively arranged.

(Third Embodiment)

Figure 5A:
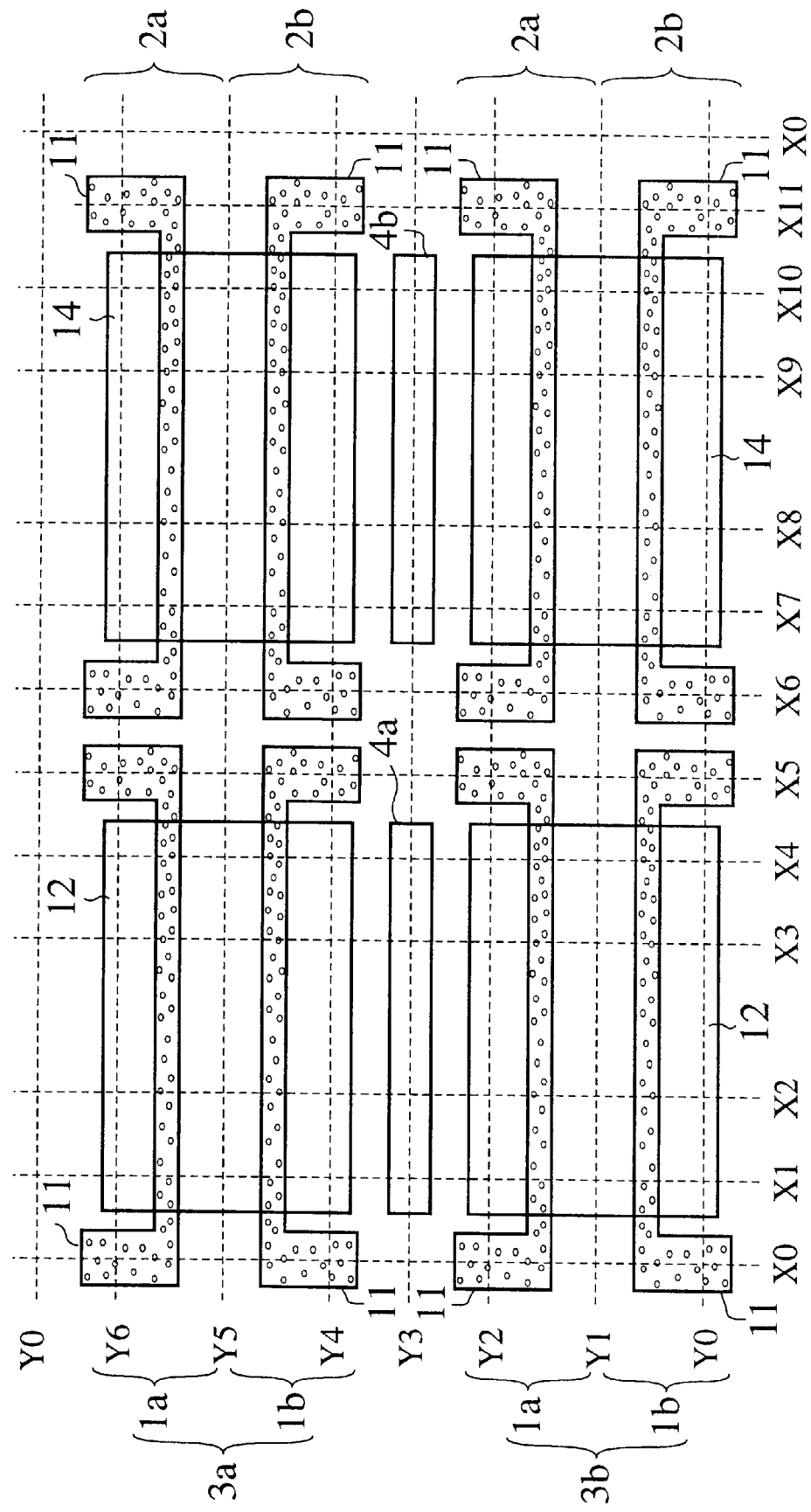
FIG. 5A is a schematic plan view showing layout patterns of gate basic cells in a semiconductor integrated circuit according to a third embodiment of the present invention together with a wiring channel grid.
Figure 5B:
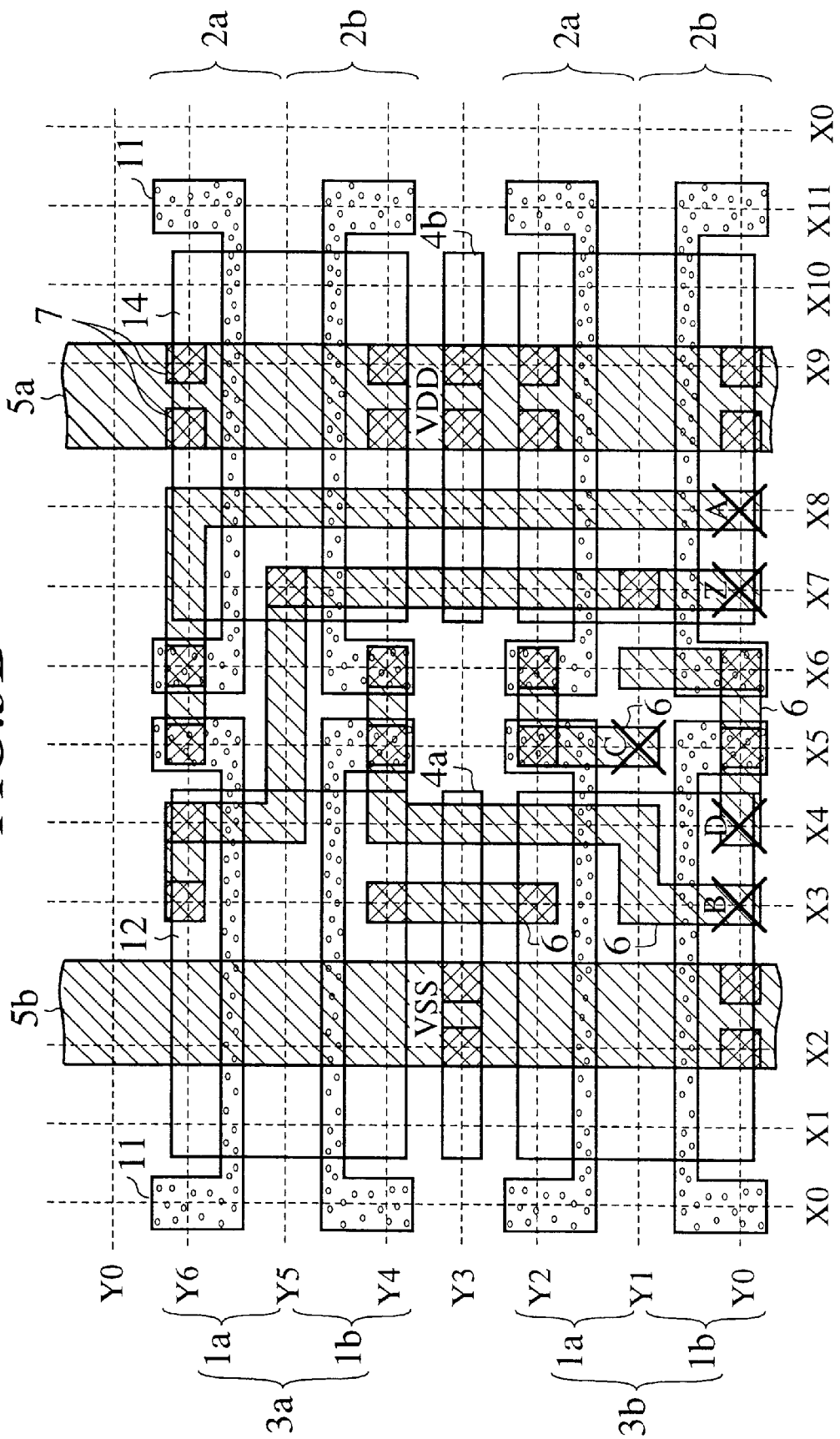
FIG. 5B is a schematic plan view showing layout patterns of the functional blocks in which metal wiring layers are arranged on the configuration shown in FIG. 5A.
Figure 5C:
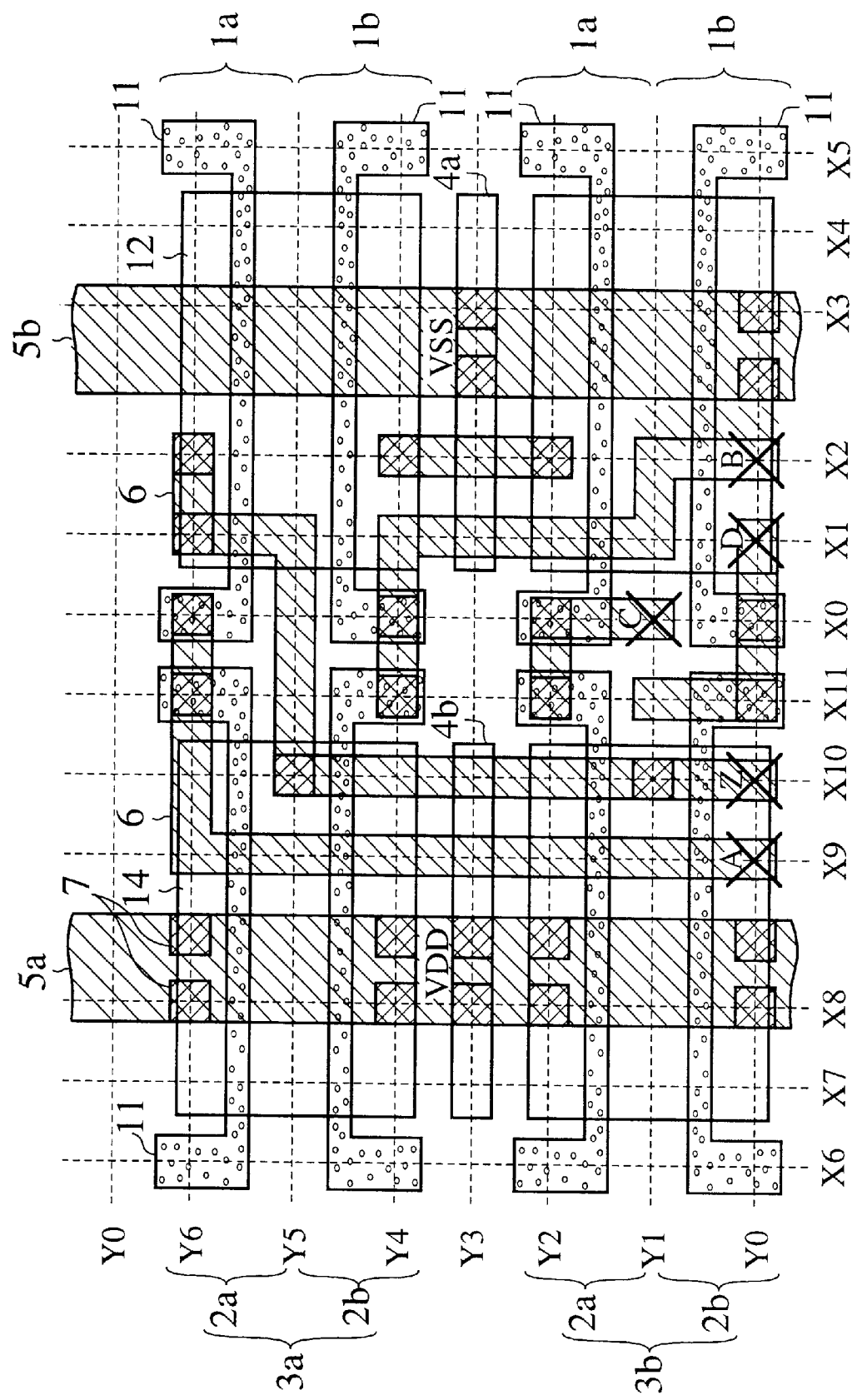
FIG. 5C is a schematic plan view showing layout patterns of a functional block in which the configuration in FIG. 5B is flip-arranged.

FIGS. 5A to 5C are views showing a configuration of a semiconductor integrated circuit according to a third embodiment of the present invention. A key feature of a layout of gate basic cells shown in FIG. 5A resides in the wiring channel grid comprising lateral and vertical lines, both having two kinds of spacings. Namely, lateral lines consist of the lines Y0-Y2, Y4-Y6 having the first spacing and the lines Y2-Y4, Y6-Y0 having the second spacing. And vertical lines consist of the lines X2-X3, X8-X9 having the third spacing and the lines X0-X2, X3-X8, X9-X11-X0 having the fourth spacing. In other words, in contrast to the layout shown in FIG. 2A, the third spacing between the lines X2-X3, X8-X9 is made wider than the fourth spacing between the lines X0-X2, X3-X8, X9-X11-X0. As being similar to FIG. 2A, the first spacing is set wider than the second spacing. Further, the prominent feature of the third embodiment lies in an asymmetrical disposition. Based upon the wiring channel grid shown in FIG. 5B, the VDD (higher potential) power supply wiring 5a is formed to shift its wiring center with respect to the line X9 constituting the wiring channel grid. In like manner, the VSS (lower potential) power supply wiring 5b is formed to shift its wiring center with respect to the line X2. In the third embodiment of the present invention, a size of the wiring channel grid can be reduced in the X direction than that of the second embodiment while keeping the same width of the power supply wiring as that in FIG. 4B. Further, in the third embodiment of the present invention, since the layout of the vertical lines is symmetrical in the X direction, the flip arrangement of FIG. 5B can be readily carried out, as shown in FIG. 5C.

Figure 5D:
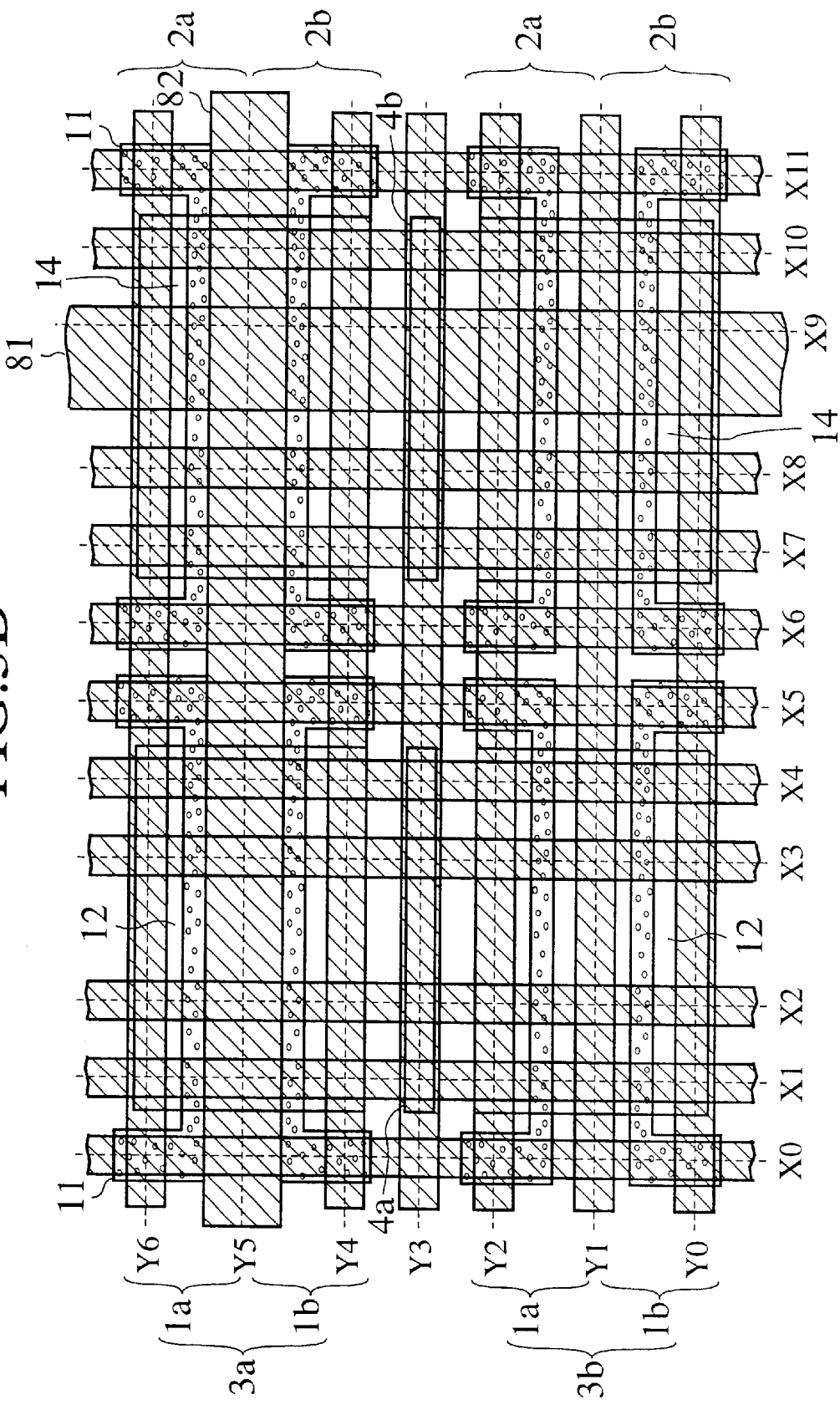
FIG. 5D is a plan view showing a configuration of a semiconductor integrated circuit according to a modification of the third embodiment of the present invention.

FIG. 5D is a view showing a configuration of a semiconductor integrated circuit according to a modification of the third embodiment of the present invention. A layout of wiring layers shown in FIG. 5D is characterized in that, in a multilevel wiring structure, an interconnection 81 formed as a first metal layer along the line X9 constituting the wiring channel grid and another interconnection 82 formed as a second metal layer along the line Y5 are set wide in the gate basic cell region shown in FIG. 5A. Utilizing these interconnections 81, 82, not only the power supply wirings but also special signal wirings such as the clock signal wirings and wirings requiring a large current handling capability can be made wide. According to the modification of the third embodiment of the present invention shown in FIG. 5D, special signal wirings such as the clock signal wirings which need a wide wiring width, the signal wirings like the interconnections for analogue circuits through which a large current flows can be easily formed as wide interconnections.

(Fourth Embodiment)

Figure 6A:
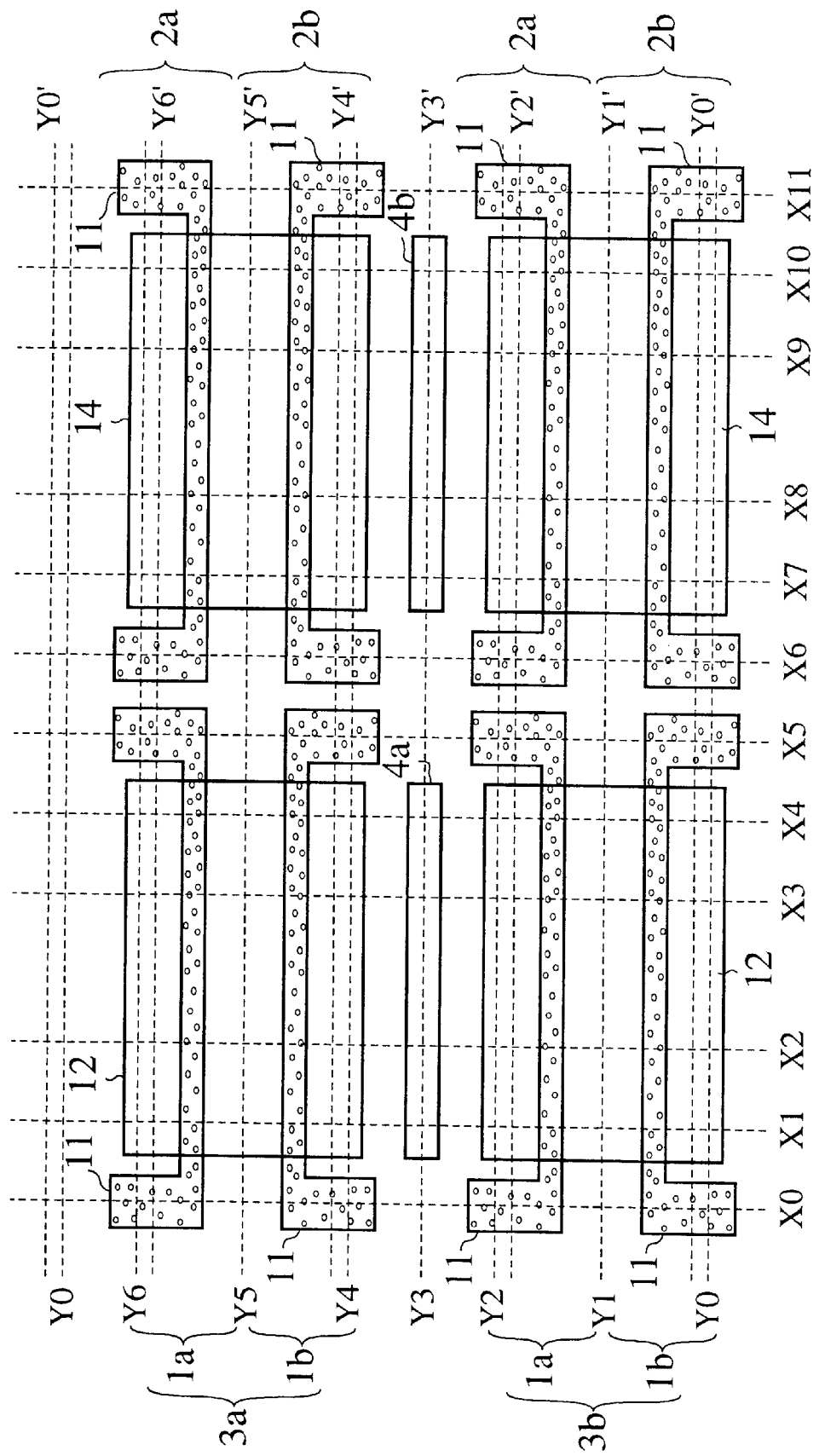
FIG. 6A is a schematic plan view showing layout patterns of gate basic cells in a semiconductor integrated circuit according to a fourth embodiment of the present invention together with a set of wiring channel grids.

FIGS. 6A to 6E are views showing a configuration of a semiconductor integrated circuit according to a fourth embodiment of the present invention. A key feature of a layout of gate basic cells shown in FIG. 6A is that two kinds of wiring channel grids are provided superposedly, in which lines Y2 and Y4 are shifted outwardly as new lateral lines Y2' and Y4' in order to make spacings between lateral lines Y2-Y3 and Y3-Y4 constituting a first wiring channel grid wider so as to generate a second wiring channel grid. In addition, in order to provide symmetry to the second wiring channel grid in the Y direction, the lateral line Y0 is shifted toward the line Y1 (Y1') to generate new lateral line Y0', and the lateral line Y6 is shifted toward the line Y5 (Y5') to generate new lateral line Y6'. In other words, in the fourth embodiment of the present invention, a second wiring channel grid consisting of lateral lines Y0'-Y2', Y4'-Y6' having a fifth spacing, lateral lines Y2'-Y4' having a sixth spacing, and lateral lines Y6'-Y0' having a seventh spacing is superposed to a first wiring channel grid consisting of lateral lines Y0-Y6 having the first and second spacings and vertical lines X0-X11 having the third and fourth spacings shown in FIG. 5A. Vertical lines of the second wiring channel grid are identical to those in the first wiring channel grid and consist of lines having the third and fourth spacings. The lateral lines Y1, Y3, Y5 of the first wiring channel grid are aligned on the same positions as the lateral lines Y1', Y3', Y5' of the second wiring channel grid to form identical straight lines respectively.

Figure 6B:
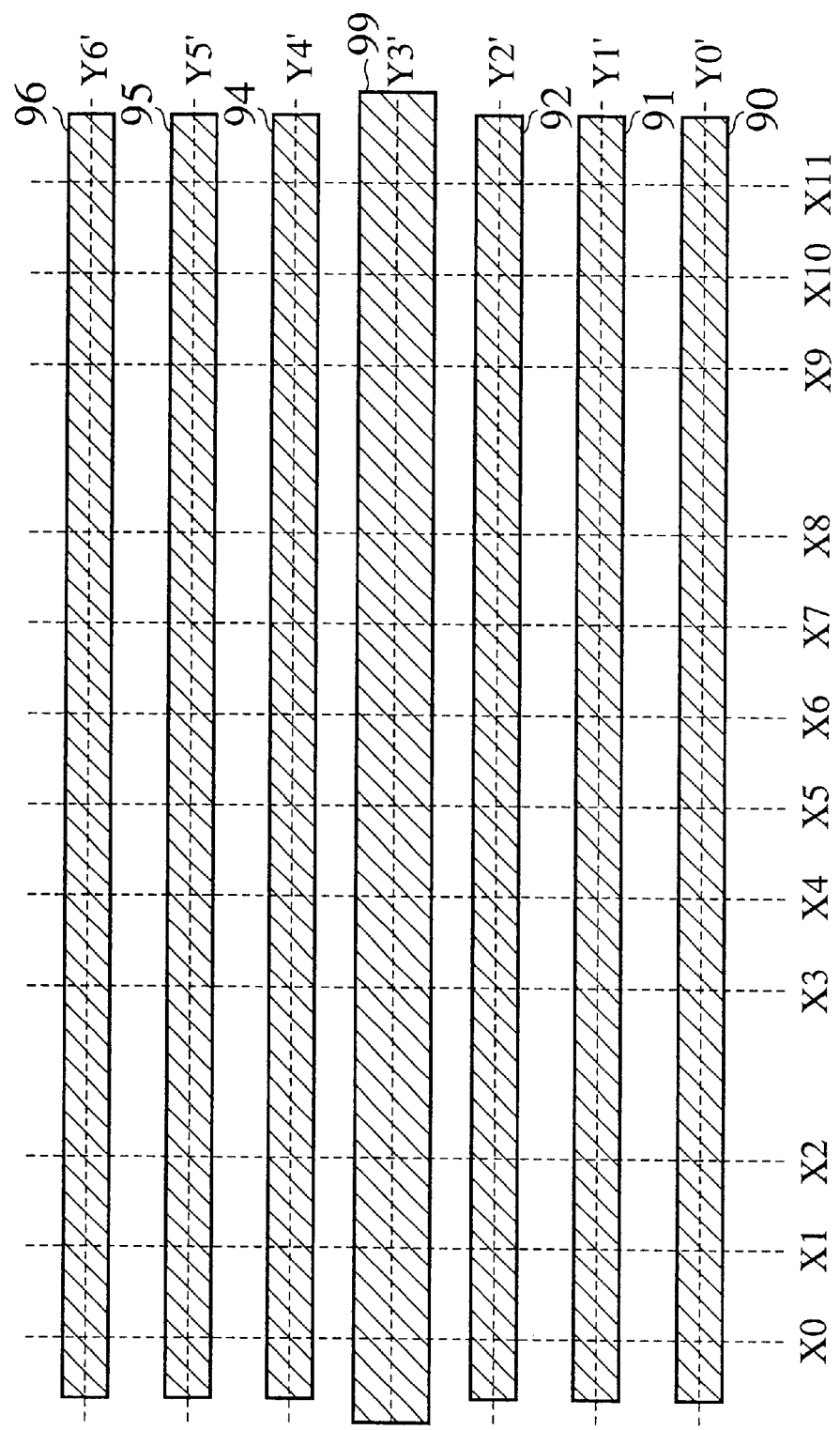
FIG. 6B is a schematic plan view showing wiring layout patterns of second layer metal wirings which are arranged on FIG. 6A.

In this manner, by setting the first and second wiring channel grids having different pitches superposedly, as shown in FIG. 6B, it is feasible to form multilevel wirings in which interconnections formed as a second metal layer along the line Y3' can be formed as a wide power supply supplement wiring 99 to assure a large current handling capability. In FIG. 6B, other interconnections 90 to 92, 94 to 96, formed as the second metal layer, serving as ordinary signal wirings are formed along the lines Y0'-Y2', Y4'-Y6' constituting the wiring channel grid.

Figure 6C:
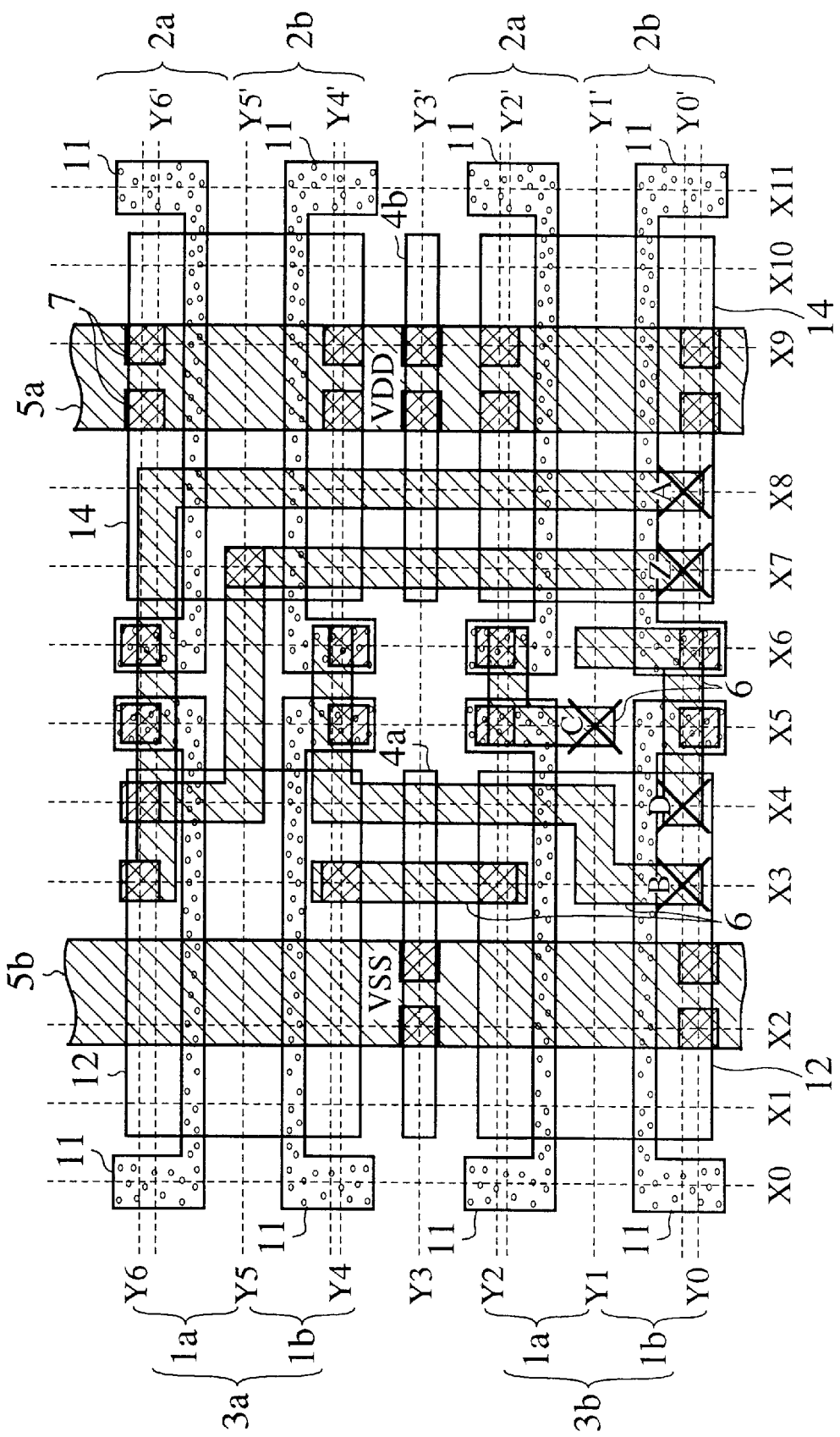
FIG. 6C is a schematic plan view showing layout patterns of a functional block including first layer metal wirings arranged on FIG. 6A.
Figure 6D:
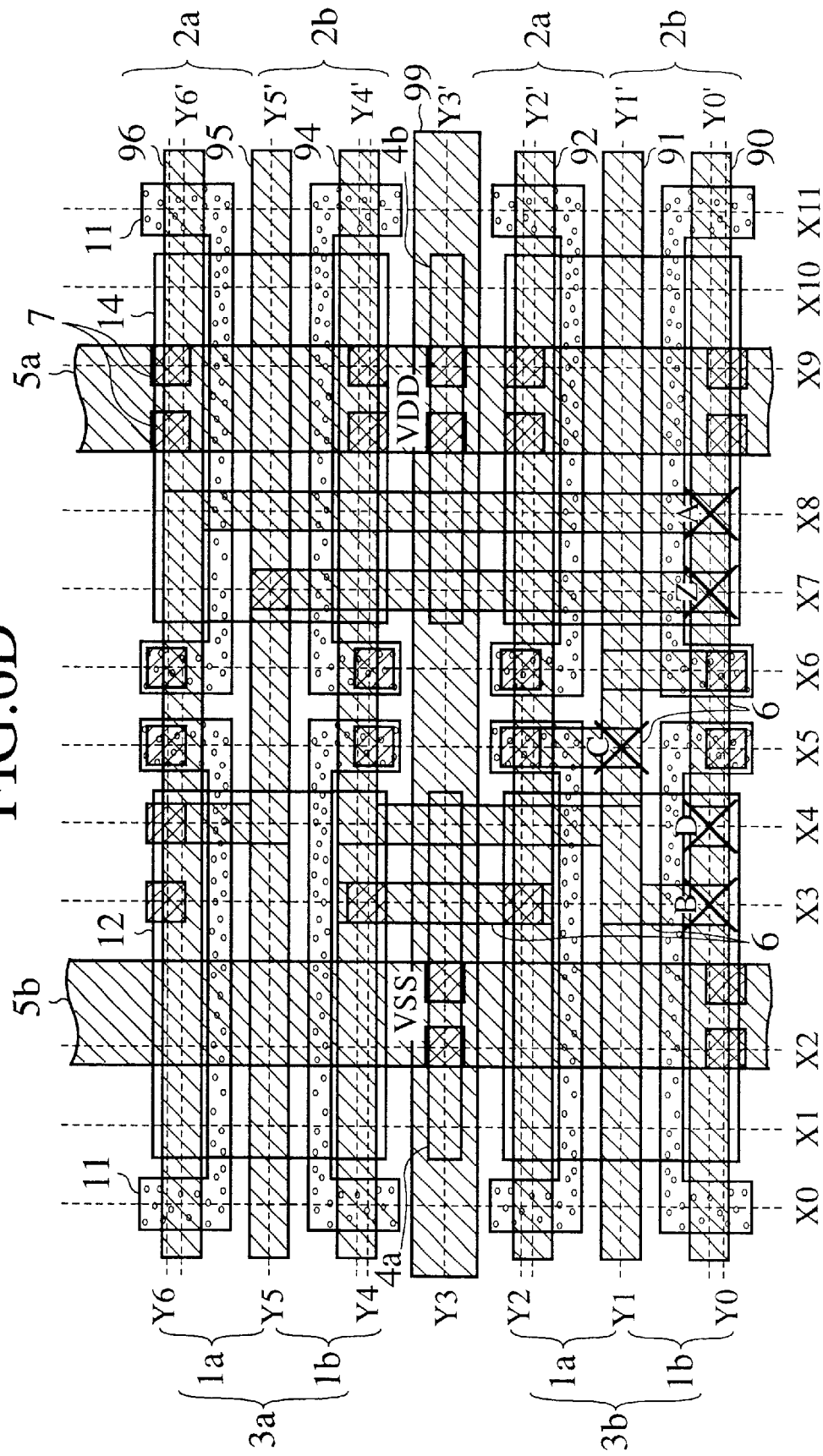
FIG. 6D is a schematic plan view showing layout patterns of the multilevel wirings in which first and second layers metal wirings are shown together.

FIG. 6C is a plan view showing the first metal layer in the multilevel wiring structure. So as to constitute a four-input NAND gate on the gate basic cells shown in FIG. 6A, the wirings on the first metal layer are provided with the use of the vertical lines X0-X11 and the lateral lines Y0'-Y6' in the second wiring channel grid. Contact holes for the gate basic cells are formed with the use of the vertical lines X0-X11 and the lateral lines Y0-Y6 in the first wiring channel grid. FIG. 6D is a plan view showing the multilevel wirings in which the layout pattern of the second metal layer shown in FIG. 6B is superposed to the layout pattern of the first metal layer shown in FIG. 6C. Only the lines X0-X11, Y0'-Y6' of the lines constituting the second wiring channel grid have to be regarded by the layout CAD, and connection through via holes between the first and second metal layers can be easily made.

Figure 6E:
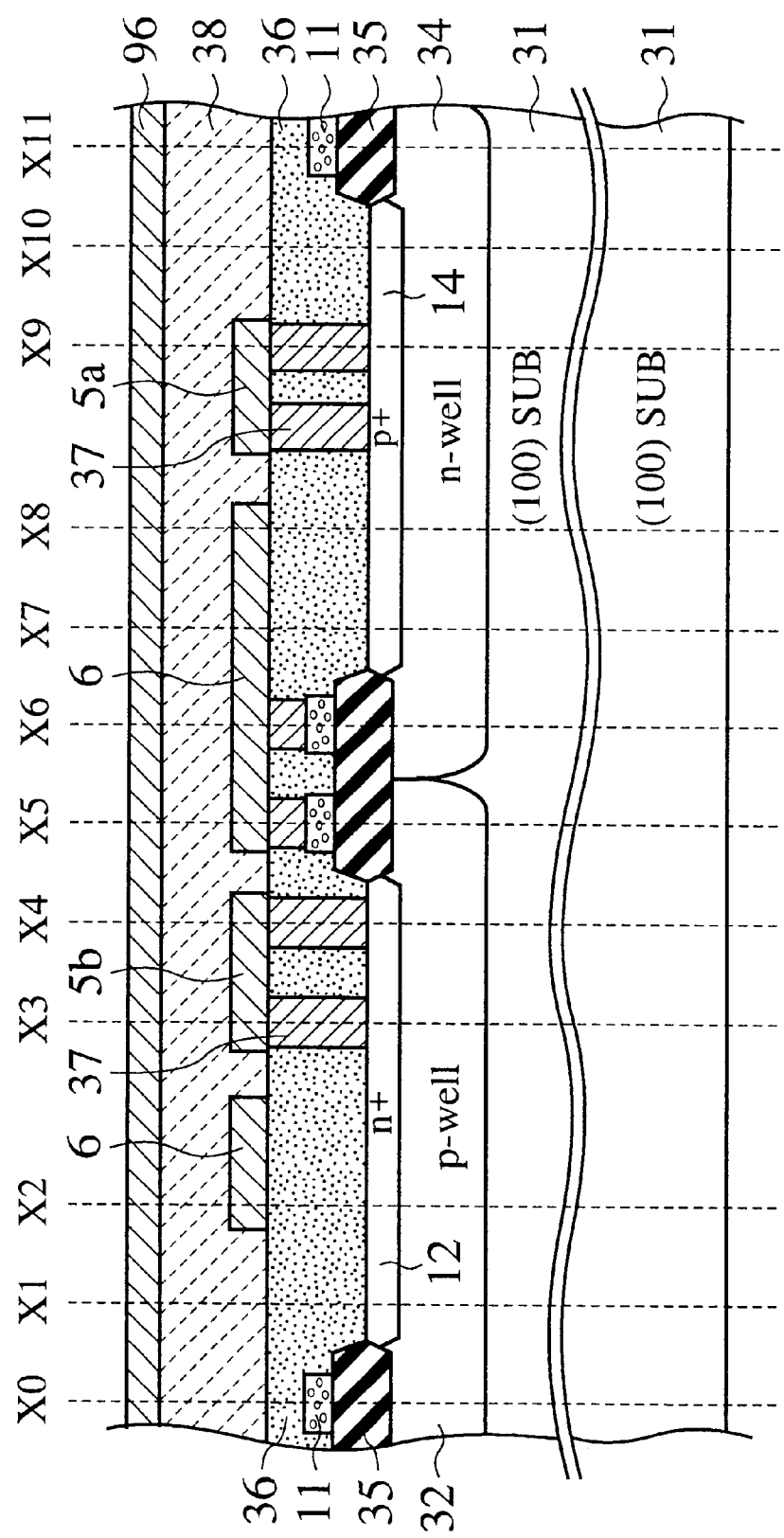
FIG. 6E is a sectional view, taken along Y6 direction on the layout patterns shown in FIG. 6D.

FIG. 6E is a sectional view taken along the line Y6 constituting the first wiring channel grid in FIG. 6D. As shown in FIG. 6E, a p-well 32 and an n-well 34 are formed on the silicon (100) substrate 31. The transistor regions are defined by a field oxide film 35. An $n^+$ diffusion layer 12 serving as source/drain regions of the n-MOS and a $p^+$ diffusion layer 14 serving as source/drain regions of the p-MOS are formed in the window portions of the field oxide film 35. Gate polysilicon regions 11 extended from upper surfaces of gate oxide films, though not shown, are formed on the field oxide film 35. A first interlayer insulating film 36 such as SiO$_2$ film, PSG film, BPSG film is then deposited on an overall surface of a resultant structure. The upper surface of the first interlayer insulating film 36 is planarized by virtue of CMP, etc. The higher potential (VDD) power supply wiring 5a, the lower potential (VSS) power supply wiring 5b, and the signal wirings 6, all serving as the first metal layer and made of Al, Al—Si, Al—Cu—Si, etc., are then formed on the first interlayer insulating film 36. These wirings of the first metal layer are electrically connected to the source/drain regions 12, 14 and the gate polysilicon regions 11 via plug electrodes 37 made of doped-polysilicon W, Ti, WSi$_2$, etc. which are embedded in the contact holes. A second interlayer insulating film 38 made of SiO$_2$ film, PSG film, etc. is formed on the higher potential power supply wiring 5a, the lower potential power supply wiring 5b, and the signal wirings 6. Interconnection 96 of the second metal layer is formed on the second interlayer insulating film 38.

According to the fourth embodiment of the present invention shown in FIGS. 6A to 6E, while wiring width for the power supply wirings and/or special signal wirings such as analogue signal wirings and clock signal wirings are maintained wide, the multilevel wiring structure can be easily attained, in which the miniaturizable signal wirings can be made as narrow as possible. Even if a considerable gap resides between the design rule for the wiring process allowing narrowed signal wirings and the design rule for the basic cell process which is hard to miniaturize, the semiconductor integrated circuit having more miniaturized multilevel wiring structure can be implemented by using both design rules mixedly.

(Fifth Embodiment)

Figure 7A:
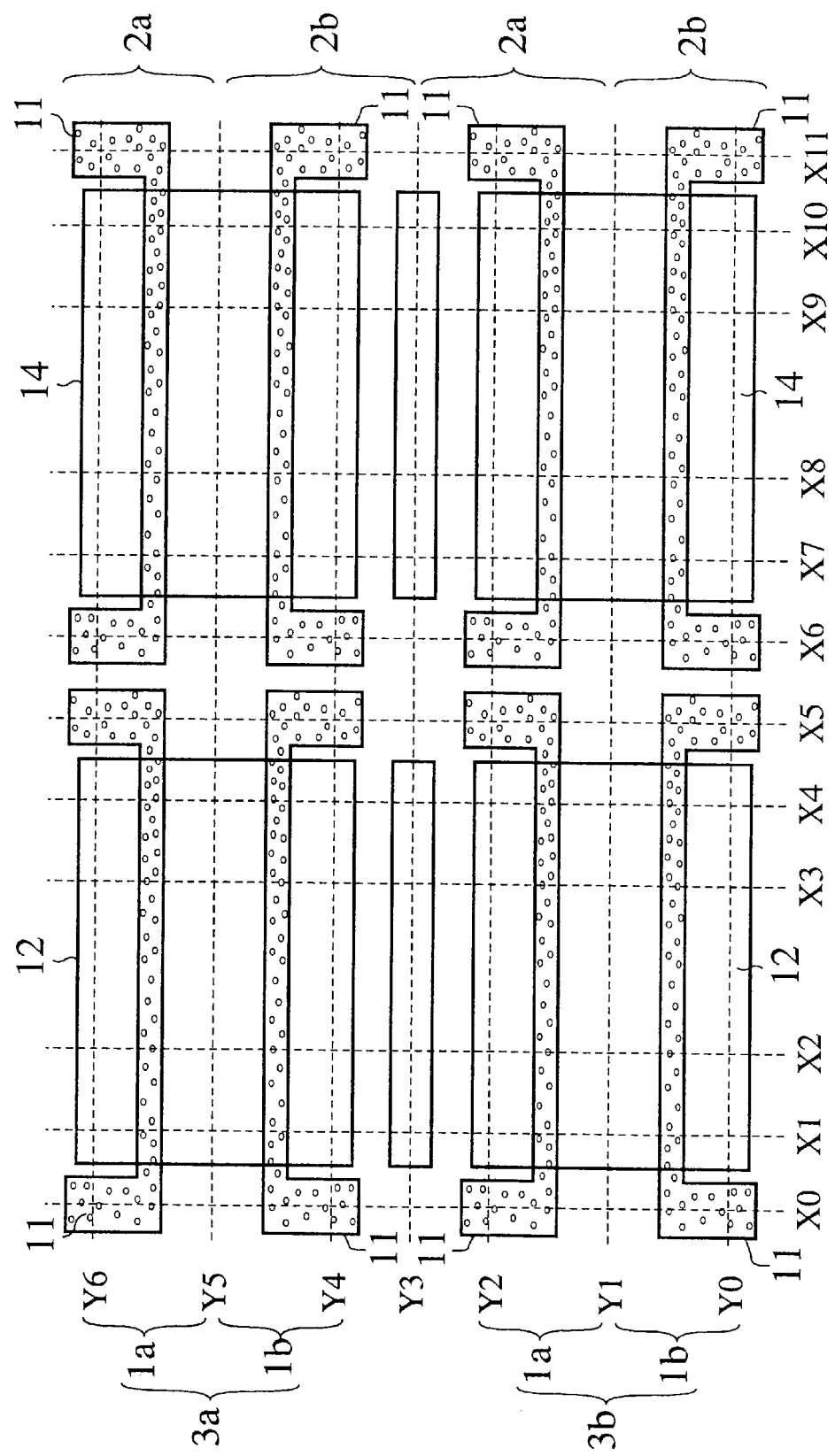
FIG. 7A is a schematic plan view showing layout patterns of gate basic cells in a semiconductor integrated circuit according to a fifth embodiment of the present invention together with a wiring channel grid.
Figure 7B:
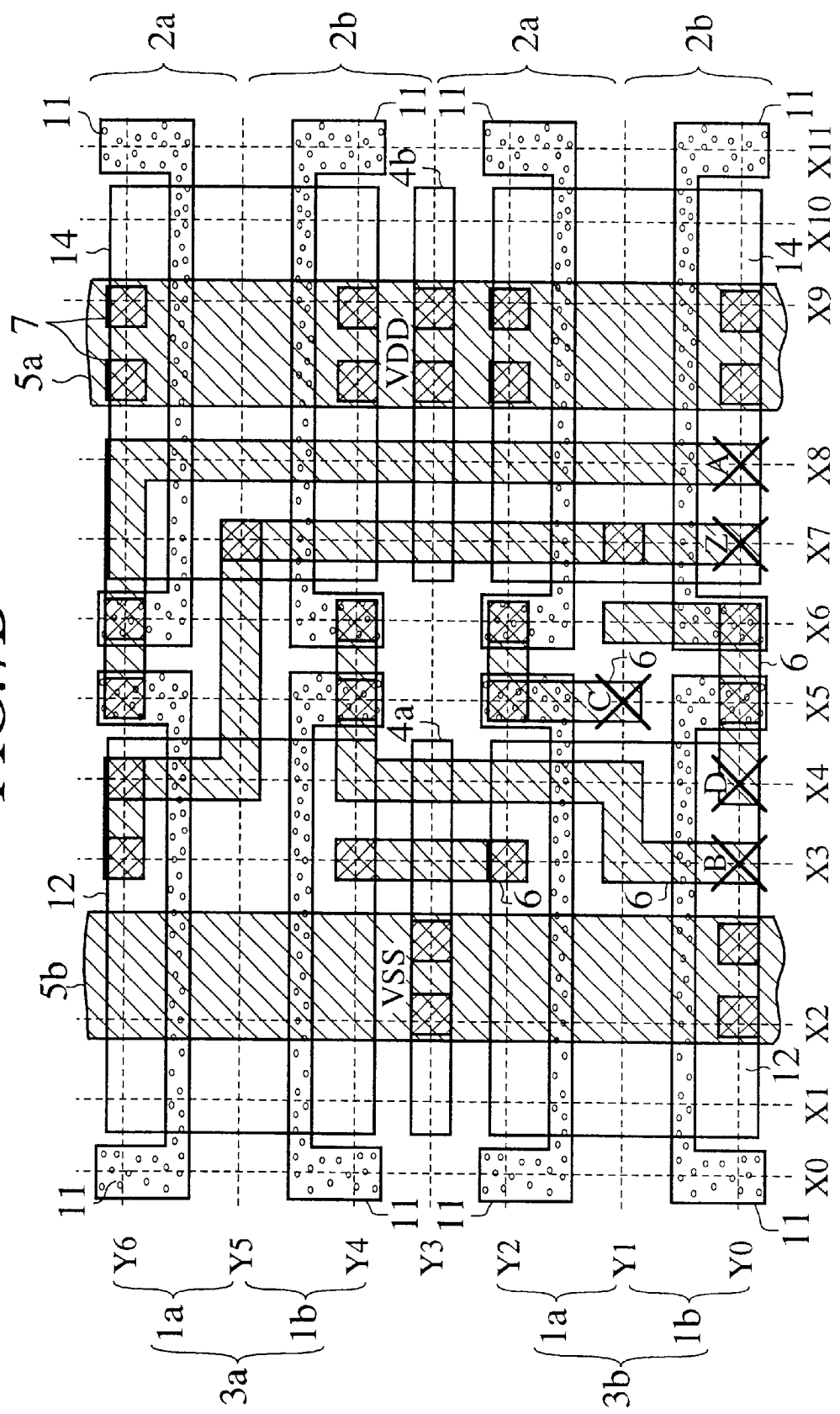
FIG. 7B is a schematic plan view showing layout patterns of a functional block in which metal wiring layers are arranged on the configuration shown in FIG. 7A.
Figure 7C:
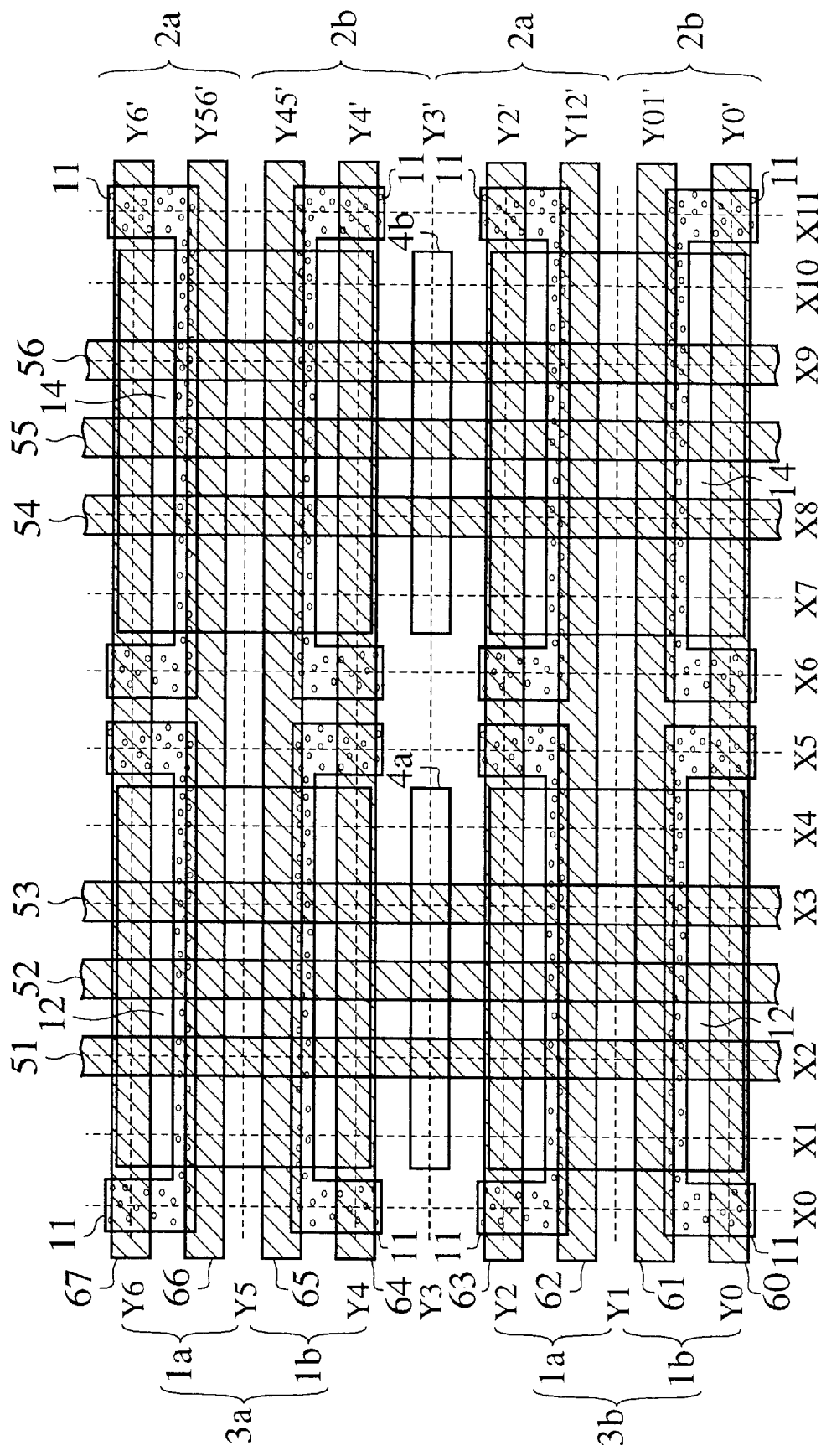
FIG. 7C is a schematic plan view showing wiring layout patterns wherein another metal wiring layers are arranged on the configuration in FIG. 7A.

FIGS. 7A to 7C are views showing a configuration of a semiconductor integrated circuit according to a fifth embodiment of the present invention. A key feature of a layout of the gate basic cells shown in FIG. 7A is directed to an aspect that a third spacing between the vertical lines X2-X3, X8-X9 constituting the wiring channel grid and a first spacing between the lateral lines Y0-Y1-Y2, Y4-Y5-Y6 are expanded much more rather than the layout in the third embodiment shown in FIG. 5A. In an arrangement of the gate basic cells in the wiring channel grid, as shown in FIG. 7A, the power supply wirings 5a, 5b serving as the first metal layer can be formed as wider wirings, as shown in FIG. 7B. Alternatively, if a space between a couple of lines constituting the grid is used as a wiring region, as shown in FIG. 7C, an interconnection 52 can be formed between interconnections 51, 53 serving as the first metal layer and formed along the lines X2 and X3. And further another interconnection 55 can be formed between first metal layer interconnections 54, 56 formed along the lines X8 and X9. In addition, an interconnection 61 serving as a second metal layer can be formed along a new line segment Y01' which is hypothetically supposed between the lines Y0 and Y1 in the wiring channel grid, and another interconnection 62 can be formed along a new line segment Y12' which is hypothetically supposed between the lines Y1 and Y2 in the wiring channel grid, then another interconnection 65 can be formed along a new line segment Y45' which is hypothetically supposed between the lines Y4 and Y5 in the wiring channel grid, and further another interconnection 66 can be formed along a new line segment Y56' which is hypothetically supposed between the lines Y5 and Y6 in the wiring channel grid. For this reason, a layout efficiency can be improved by increasing the number of interconnections on the wiring region disposed between lines. Moreover, this fifth embodiment is more effective when the miniaturization are enhanced much more and the gap of feature size between the wiring process and the basic cell process is enlarged.

Although in the fifth embodiment of the present invention, the case that the number of the signal wirings is increased by expanding the third spacing between the lines X2-X3, X8-X9 and the first spacing between the lines Y0-Y1-Y2, Y4-Y5-Y6 much more is explained, a layout effect or the layout efficiency can be improved by increasing the number of interconnections without expanding the pitches of the wiring channel grid, if the difference between the design rules for the wiring process and the basic cell process becomes remarkable. Therefore, in the advanced stage of miniaturization, in which difference between the design rules for the wiring process and the basic cell process becomes extremely large, it is possible to maintain the widths of the power supply wirings and the special signal wirings at relatively large constant values and make the width of signal wirings narrower and narrower so that obtaining a layout having a high area efficiency.

(Sixth Embodiment)

FIGS. 8A to 8D are views showing a configuration of a semiconductor integrated circuit according to a sixth embodiment of the present invention. Though the wirings within respective functional blocks are explained mainly in the first to fifth embodiments of the present invention, mutual connection patterns between the functional blocks will be mentioned in the sixth embodiment of the present invention, in which a semiconductor chip is designed by disposing plural functional blocks on a semiconductor wafer.

Figure 8A:
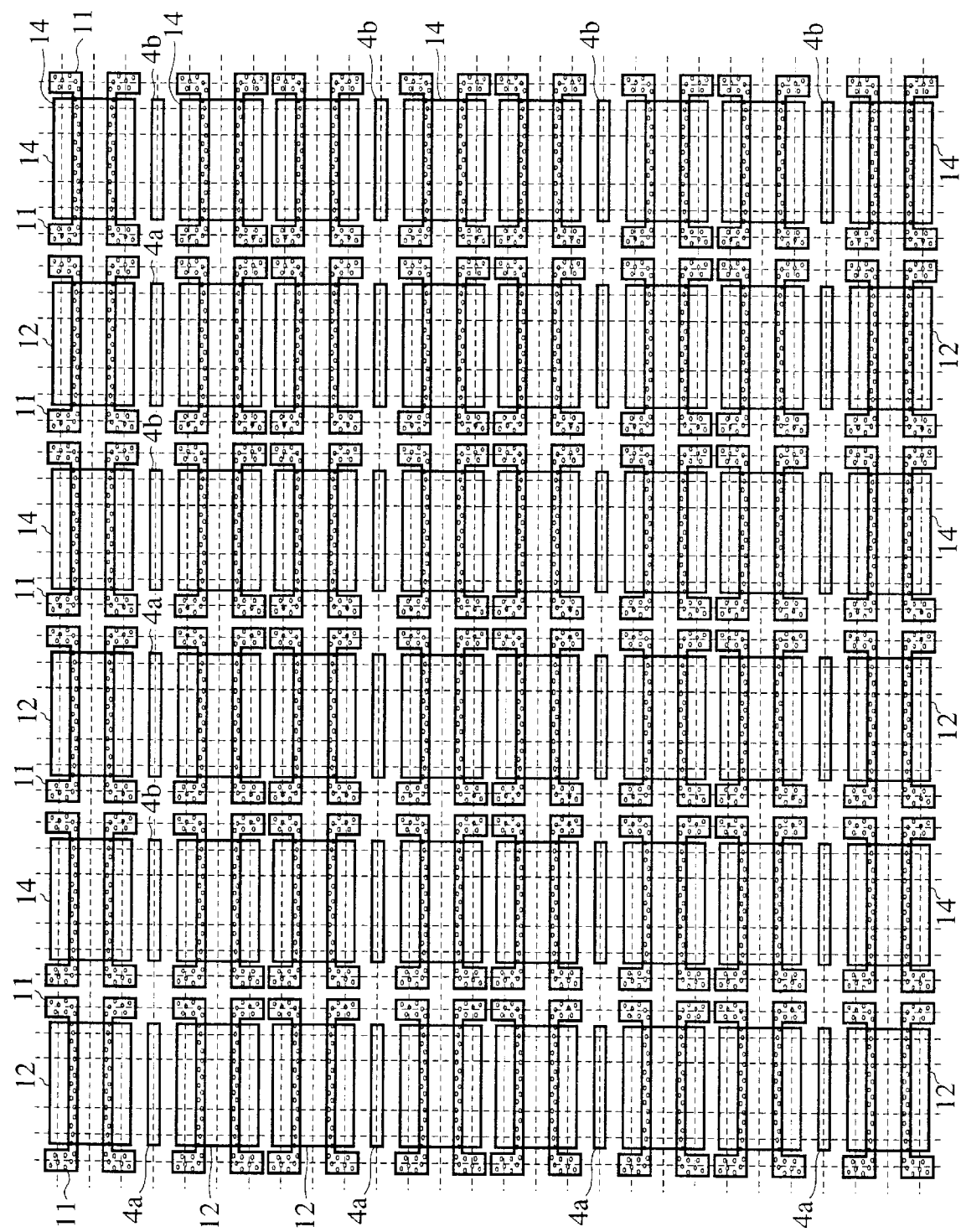
FIG. 8A is a plan view showing layout patterns of a plurality of gate basic cells in a semiconductor integrated circuit according to a sixth embodiment of the present invention together with a wiring channel grid.

FIG. 8A shows a layout of the gate basic cells equivalent to repetition patterns in FIGS. 2A, 3A, 4A, 5A and 6A. In FIG. 8A, by making use of an n$^+$ source/drain region 12 of the n-MOS and a p$^+$ source/drain region 14 of the p-MOS as one set, three sets of the gate basic cells are arranged laterally (in a row). Like the first to fifth embodiments of the present invention, the substrate/contact regions 4a, 4b are arranged between upper and lower gate basic cells, whereby two gate basic cells may constitute one block. FIG. 8A corresponds to a view in which four blocks are arranged in the vertical direction (in a column), and is a plan view showing twenty-four gate basic cells are arranged as a whole. FIG. 8A is a view showing a part of the semiconductor integrated circuit according to the sixth embodiment of the present invention. It is of course that the number of the gate basic cells on the semiconductor chip can be set to arbitrary number according to design specification of the LSI.

Figure 8B:
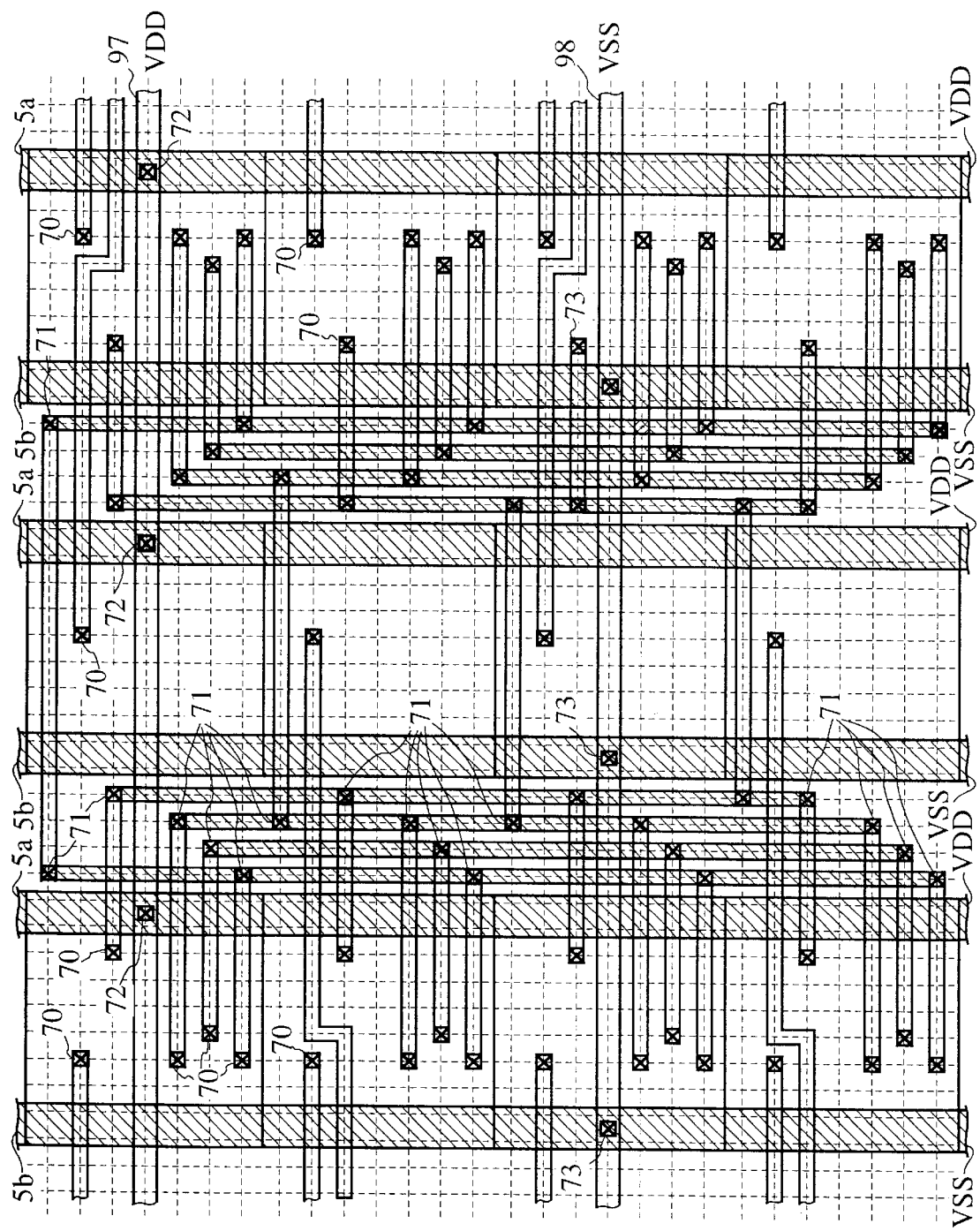
FIG. 8B is a plan view showing metal wirings for connecting a plurality of functional blocks in the semiconductor integrated circuit according to the sixth embodiment of the present invention.
Figure 8C:
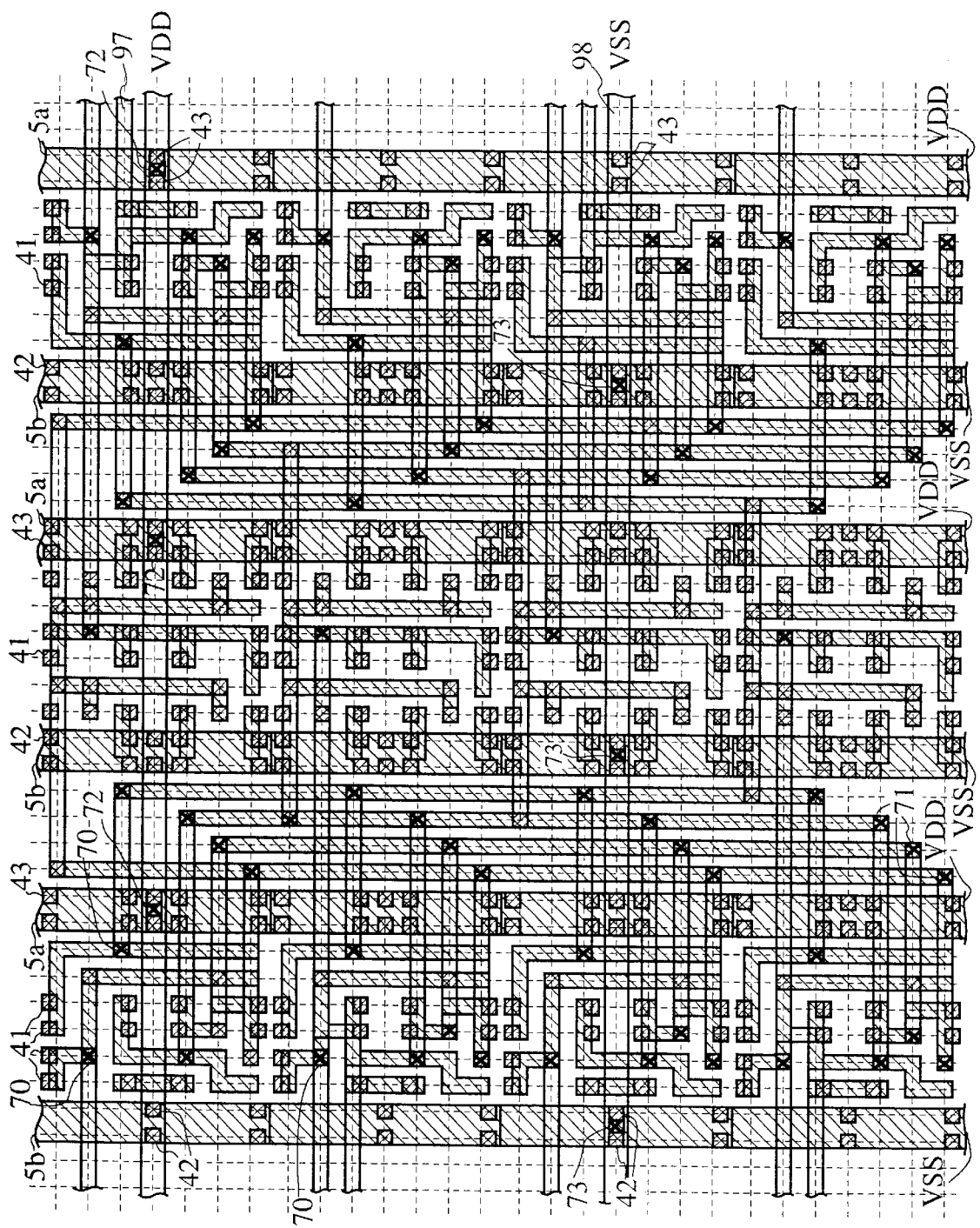
FIG. 8C is a plan view showing a multilevel wiring configuration wherein metal wirings in each functional block are further added to the configuration in FIG. 8B.

FIG. 8B is a view showing metal interconnections for use in connection between plural functional blocks on the gate basic cells shown in FIG. 8A. As shown in FIGS. 8A and 8B, the wiring channel grid is composed on the gate basic cells such that the lateral lines having the first and second spacings and the vertical lines having the third and fourth spacings are provided mutually orthogonally. The metal interconnections to connect the functional blocks mutually are arranged along the wiring channel grid. In FIG. 8B, the four-input NAND gate is formed of the left column of gate basic cells, an inverter is formed of the central column of gate basic cells, and a four-input NOR gate is formed of the right column of gate basic cells. In other words, a functional block column composed of four four-input NAND gates is arranged on the left side, a functional block column composed of four inverters is arranged on the central side, and a functional block column composed of four NOR gates is arranged on the right side. Thus twelve (=4×3) functional blocks are arranged as a whole. Since the vertical lines are arranged based on the third and fourth spacings to constitute the wiring channel grid, the VDD (higher potential) power supply wiring 5a and the VSS (lower potential) power supply wiring 5b can be made wide while other signal wirings can be made narrow. A wide power supply supplement wiring 97 is connected to the VDD power supply wirings 5a through via holes 72, and another wide power supply supplement wiring 98 is connected to the VSS power supply wirings 5b through via holes 73. The spacing between the narrow signal wirings can be made narrow inasmuch as it is allowed by the photolithography technique. FIG. 8C shows the multilevel wiring patterns in which the interconnections, the contact holes, 41, 42, 43 and the via holes 70, 71, 72, 73 are formed in respective functional blocks so as to overlap the structure in FIG. 8B. As shown in FIG. 8C, in the sixth embodiment of the present invention, a part of the contact holes are arranged on lines shifted from those for the metal interconnections. More particularly, with the use of the first and second wiring channel grids having different lateral lines superposedly, the metal interconnections, the via holes and a part of the contact holes are formed along the first wiring channel grid and most of the contact holes are formed along the second wiring channel grid (Only the first wiring channel grid is shown, and the second wiring channel grid is not shown in FIGS. 8A, 8B and 8C to avoid cluttering up the drawings. The configurations consisting of the first and second wiring channel grids are similar to those shown in FIGS. 6D, 7B and 7C). By using two types of the wiring channel grids, miniaturization of the patterns is enabled even if the design rule for the wiring process is different from the design rule for the basic cell process. Furthermore, since the VDD (higher potential) power supply wiring 5a and the VSS (lower potential) power supply wiring 5b are formed wide, the number of the contact holes which being associated with these power supply wirings can be increased twice. Because of twice contact holes, an effective contact hole area can be increased, so that the problem of increase in the contact resistance according to miniaturization of the size of the contact hole can be avoided. Therefore, even in the case that the semiconductor integrated circuit is miniaturized and the integration density is increased, the problem of power supply voltage drop is not caused. Since the width of the power supply wiring is set to a predetermined width to lower the current density, there is no necessity of considering poor performance due to higher resistance of the power supply wiring, breaking of wiring, etc. ascribable to electromigration, stress migration, etc. The first and second spacings serving as the spacing between the lateral lines may be determined by design specifications, so that miniaturization can be achieved as much as possible while maintaining the desired pattern margin even if the scaling for the basic cell process and the wiring process are largely different.

Figure 8D:
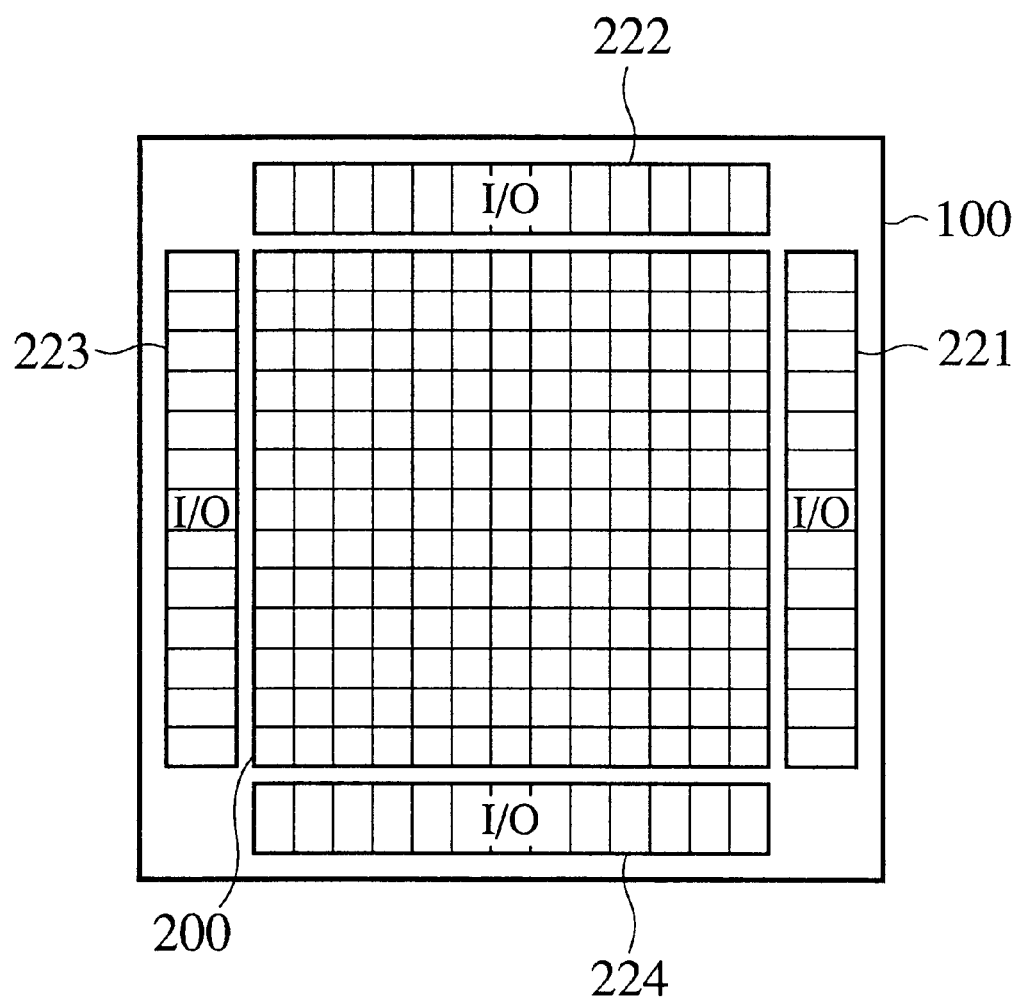
FIG. 8D is a schematic plan view showing an overall chip of the semiconductor integrated circuit according to the sixth embodiment of the present invention.

FIG. 8D is a schematic plan view showing an overall chip of the semiconductor integrated circuit according to the sixth embodiment of the present invention. A core portion 200, in which a plurality of functional blocks are arranged, is placed in the central portion of a semiconductor chip 100. FIGS. 8A to 8C show a part of the core portion 200. I/O cell portions 221 to 224 for supplying the power supply voltage and the input signals to the core portion 200, and fetching the output signals from the core portion 200 are arranged in a peripheral portion of the semiconductor chip 100.

As described earlier, according to the sixth embodiment of the present invention, miniaturization can be achieved as much as possible while maintaining the desired pattern margin even if the design rules or scaling for the basic cell process and the wiring process are largely different. In particular, it is advantageous to the MOS integrated circuit having a feature size of the sub-quartermicron order. In addition, since the signal wirings to pass a large current and the power supply wirings can be formed wide, no problem of gate delay due to wiring resistance occurs and thus the high integration density LSI which enables high speed and low power dissipation operation can be provided. The wiring defects due to electromigration or stress migration can be avoided to assure high reliability and also yield of production can be improved. It is of course that any of the wiring channel grids shown in the first to fifth embodiments may be employed as the wiring channel grid according to the sixth embodiment of the present invention.

Various modifications will become possible for those skilled in the art after receiving the teachings of the present disclosure without departing from the scope thereof.

What is claimed is:

1. A master slice LSI comprising:
a semiconductor substrate;
a plurality of basic cells periodically and densely arranged on the semiconductor substrate in a X-Y matrix form and without a routine channel between the basic cells, each of the basic cells comprising:
impurity doped regions serving as source and drain regions;
a gate polysilicon having first and second rectangular end regions and an active gate region sandwiched between the first and second rectangular end regions, the gate polysilicon disposed along a X direction on a part of the semiconductor substrate sandwiched by the impurity doped regions;
an interlayer insulating film disposed on the gate polysilicon and the impurity doped regions, the interlayer insulating film having contact holes so as to expose a part of the impurity doped regions and the first and second rectangular end regions of the gate polysilicon, positions of the contact holes being determined by cross points of a grid, the grid corresponding to a wiring channel grid employed in a design stage of the master slice LSI; and
interconnections disposed on the interlayer insulating film, the interconnections formed as a first metal layer directly connecting to the contact holes, positions of the interconnections being determined by the grid, the wiring channel grid being prescribed with respect to the basic cells and having X directional lines and non-uniformly spaced Y directional lines, the Y directional lines comprise a central set of lines running in the central portion of the impurity doped region and a peripheral set of lines having a spacing narrower than the spacing of the central set of lines, the peripheral spacing being defined as a distance between a gate contact hole disposed on the second rectangular end region of the gate polysilicon and a nearest neighboring diffusion contact hole measured along the X direction from the gate contact hole, the nearest neighboring diffusion contact hole being disposed on and nearest to a Y directional edge of the impurity doped region.

2. A master slice LSI comprising:
a semiconductor substrate;
a plurality of basic cells periodically and densely arranged on the semiconductor substrate in a X-Y matrix form and without a routing channel between the basic cells, each of the basic cells comprising:

impurity doped regions serving as source and drain regions;

a gate polysilicon having first and second rectangular end regions and an active gate region sandwiched between the first and second rectangular end regions, the gate polysilicon disposed along a X direction on a part of the semiconductor substrate sandwiched by the impurity doped regions; and an interlayer insulating film disposed on the gate polysilicon and the impurity doped regions, the interlayer insulating film having minimum contact holes so as to expose a part of the impurity doped regions and the first and second rectangular end regions of the gate polysilicon; and interconnections disposed on the interlayer insulating film, the interconnections formed as a first metal layer directly connecting to the minimum contact holes, positions of the interconnections being determined by a grid corresponding to a wiring channel grid employed in a design stage of the master slice LSI, the wiring channel grid being prescribed with respect to the basic cells and having non-uniformly spaced horizontal lines alone the X direction comprising a first set of lines having a first spacing and a second set of lines having a second spacing narrower than the first spacing and non-uniformly spaced perpendicular lines, the perpendicular lines comprise a third set of lines running in the central portion of the impurity doped region having a third spacing and a fourth set of lines having a fourth spacing narrower than the third spacing, the fourth spacing being defined as a distance between a gate contact hole disposed on the second rectangular end region of the gate polysilicon and a nearest neighboring diffusion contact hole measured along the X direction from the gate contact hole, the nearest neighboring diffusion contact hole being disposed on and nearest to a Y directional edge of the impurity doped region.

3. The LSI of claim 2, wherein a higher potential power supply wiring running above the basic cells is arranged such that a position of the higher potential power supply wiring is determined by a line in the third set of lines.

4. The LSI of claim 2, wherein a lower potential power supply wiring running above the basic cells is arranged such that a position of the lower potential power supply wiring is determined by a line in the third set of lines.

5. The LSI of claim 3, wherein the higher potential power supply wiring has a wiring width in which a plurality of the minimum contact holes or contact holes each having an area corresponding to the plurality of the minimum contact holes are arranged.

6. The LSI of claim 4, wherein the lower potential power supply wiring has a wiring width in which a plurality of the minimum contact holes or contact holes each having an area corresponding to the plurality of the minimum contact holes are arranged.

7. The LSI of claim 1, wherein the non-uniformly spaced lines have portions which are symmetrical with respect to a predetermined central axis.

8. The LSI of claim 2, wherein the non-uniformly spaced horizontal lines have portions which are symmetrical with respect to a predetermined central axis.

9. The LSI of claim 2, wherein the non-uniformly spaced vertical lines have portions which are symmetrical with respect to a predetermined central axis.

10. The LSI of claim 3, wherein a center line of the higher potential power supply wiring is arranged such that the position of the center line of the higher potential power supply wiring is shifted with respect to one line in the third set of lines.

11. The LSI of claim 4, wherein a center line of the lower potential power supply wiring is arranged such that the position of the center line of the lower potential power supply wiring is shifted with respect to one line in the third set of lines.

12. The LSI of claim 2, wherein a special signal wiring running above the basic cells is arranged such that a position of the special signal wiring is determined by a line in the third set of lines.

13. The LSI of claim 2, wherein a special signal wiring running above the basic cells is arranged such that a position of the special signal wiring is determined by a line in the first set of lines.

14. The LSI of claim 12, wherein the special signal wiring is a clock signal wiring or a signal wiring requiring a large current handling capability.

15. The LSI of claim 13, wherein the special signal wiring is a clock signal wiring or a signal wiring requiring a large current handling capability.

16. The LSI of claim 2, wherein interconnections which are larger in number than the first set of lines are arranged on a wiring region defined by the first set of lines.

17. The LSI of claim 2, wherein interconnections which are larger in number than the third set of lines are arranged on a wiring region defined by a third set of lines.

18. A master slice LSI comprising:

a plurality of functional blocks, each functional block comprising:

basic cells periodically and densely arranged in a X-Y matrix form and without a routing channel between the basic cells, each of the basic cells comprising:

impurity doped regions serving as source and drain regions;

a gate polysilicon having first and second rectangular end regions and an active gate region sandwiched between the first and second rectangular end regions, the gate polysilicon disposed along a X direction on a part of the semiconductor substrate sandwiched by the impurity doped regions; and an interlayer insulating film disposed on the gate polysilicon and the impurity doped regions, the interlayer insulating film having contact holes so as to expose a part of the impurity doped regions and the first and second rectangular end regions of the gate polysilicon; and first interconnections disposed on the interlayer insulating film on the basic cells, the interconnections formed as a first metal layer directly connecting to the contact holes, positions of the first interconnections being determined by a grid corresponding to a wiring channel grid employed in a design stage of the master slice LSI, the wiring channel grid being prescribed with respect to the basic cell; and second interconnections disposed on the functional blocks, positions of the second interconnections being determined by the grid, wherein the grid has non-uniformly spaced horizontal lines along the X direction comprising a first set of lines having a first spacing and a second set of lines having a second spacing narrower than the first spacing and non-uniformly spaced perpendicular lines orthogonal to the non-uniformly spaced horizontal lines, the perpendicular lines comprise a third set of lines running in the central portion of the impurity doped region having a third spacing and a fourth set of lines having a fourth spacing narrower than the third spacing, the fourth spacing being defined as a distance between a gate contact hole disposed on the second rectangular end region of the gate polysilicon and a nearest neighboring diffusion contact hole measured along the X direction from the gate contact hole, the nearest neighboring diffusion contact hole being disposed on and nearest to a Y directional edge of the impurity doped region.

19. A master slice LSI comprising:

a semiconductor substrate;

a plurality of basic cells periodically and densely arranged on the semiconductor substrate in a X-Y matrix form and without a routing channel between the basic cells, each of the basic cells comprising:

impurity doped regions serving as source and drain regions;

a gate polysilicon having first and second rectangular end regions and an active gate region sandwiched between the first and second rectangular end regions, the gate polysilicon disposed along a X direction on a part of the semiconductor substrate sandwiched by the impurity doped regions; and an interlayer insulating film disposed on the gate polysilicon and the impurity doped regions;

the interlayer insulating film having contact holes so as to expose a part of the impurity doped regions and the first and second rectangular end regions of the gate polysilicon, positions of the contact holes being determined by cross points of a first grid corresponding to a first wiring channel grid employed in a design stage of the master slice LSI, the first wiring channel grid being prescribed with respect to the basic cell, the first wiring channel grid consisting of X directional lines and non-uniformly spaced Y directional lines, the Y directional lines comprise a central set of lines running in the central portion of the impurity doped region and a peripheral set of lines having a spacing narrower than the spacing of the central set of lines, the peripheral spacing being defined as a distance between a gate contact hole disposed on the second rectangular end region of the gate polysilicon and a nearest neighboring diffusion contact hole measured along the X direction from the gate contact hole, the nearest neighboring diffusion contact hole being disposed on and nearest to a Y directional edge of the impurity doped region; and interconnections disposed on the interlayer insulating film, the interconnections formed as a first metal layer directly connecting to the contact holes, positions of the interconnections being determined by a second grid corresponding to a second wiring channel grid employed in the design stage of the master slice LSI, the second wiring channel grid having a different pitch than that of the first wiring channel grid, the second wiring channel grid being prescribed with respect to the basic cells and having non-uniformly spaced lines and other lines orthogonal to the non-uniformly spaced lines.

20. The LSI of claim 19, wherein the X directional lines comprising a first set of lines having a first spacing and a second set of lines having a second spacing narrower than the first spacing.

21. A master slice LSI comprising:

a semiconductor substrate;

a plurality of basic cells periodically and densely arranged on the semiconductor substrate in a X-Y matrix form and without a routing channel between the basic cells, each of the basic cells comprising:

impurity doped region serving as source and drain regions;

a gate polysilicon having first and second rectangular end regions and an active gate region sandwiched between the first and second rectangular end regions, the gate polysilicon disposed along a X direction on a part of the semiconductor substrate sandwiched by the polysilicon and the impurity doped regions;

an interlayer insulating film disposed on the gate polysilicon and the impurity doped regions, the interlayer insulating film having contact holes so as to expose a part of the impurity doped regions and the first and second rectangular end regions of the gate polysilicon;

a first wiring formed as a first metal layer directly connecting to the contact holes, the first wiring disposed on the interlayer insulating film along a Y direction orthogonal to the X direction; and a set of second wirings formed as a first metal layer directly connecting to the contact holes, the second wiring disposed on the interlayer insulating film with a constant pitch along the Y direction, a spacing from a center line of the first wiring to the center line of one of the second wirings disposed to nearest to the first wiring differs from the constant pitch, wherein the first and second wirings are arranged such that positions of the first and second wirings are determined by a grid corresponding to a wiring channel grid employed in a design stage of the master slice LSI, the wiring channel grid being prescribed with respect to the basic cells, the wiring channel grid has non-uniformly spaced lines along the Y direction and uniformly spaced lines along the X directions, the non-uniformly spaced lines comprise a central set of lines running in the central portion of the impurity doped region and a peripheral set of lines having a spacing narrower than the spacing of the central set of lines, the peripheral spacing being defined as a distance between a gate contact hole disposed on the second rectangular end region of the gate polysilicon and a nearest neighboring diffusion contact hole measured along the X direction from the gate contact hole, the nearest neighboring diffusion contact hole being disposed on and nearest to a Y directional edge of the impurity doped region.

22. A master slice LSI comprising:

(a) a semiconductor substrate;

(b) a plurality of basic cell sets periodically and densely arranged on the semiconductor substrate in a X-Y matrix form and without a routing channel between the basic cells, each of the basic cell sets comprising:

a first impurity doped region of a first conductivity type having upper, middle and lower areas, formed at a surface of the semiconductor substrate, the upper, middle and lower areas serving as source and drain regions;

a second impurity doped region of the first conductivity type having upper, middle and lower areas, formed at a surface of the semiconductor substrate, the upper, middle and lower areas serving as source and drain regions;

a first contact region of a second conductivity type opposite to the first conductivity type, sandwiched between the first and second impurity doped regions;

a first couple of gate polysilicons disposed along a horizontal direction on the semiconductor substrate so as to divide the first impurity doped region into upper, middle and lower areas, each of the gate polysilicons having first and second rectangular end regions;

a second couple of gate polysilicons disposed along the horizontal direction on the semiconductor substrate so as to divide the second impurity doped region into upper, middle and lower areas; and an interlayer insulating film disposed on the first and second impurity doped regions, and on the first and second couples of gate polysilicons; and (c) a plurality of contact holes formed in the interlayer insulating film so as to expose a part of the first and second impurity doped regions, configured such that contact holes on the middle areas of the first impurity doped regions are aligned on a first horizontal line, contact holes on the lower areas of the first impurity doped regions are aligned on a second horizontal line and contact holes on the first contact region are aligned on a third horizontal line, and a spacing between the first and second horizontal lines wider than the spacing between the second and third horizontal lines;

wherein the contact holes are arranged such that positions of the contact holes are determined by cross points of a grid corresponding to a wiring channel grid employed in a design stage of the master slice LSI, the wiring channel grid being prescribed with respect to the basic cells, the wiring channel grid having non-uniformly spaced horizontal and perpendicular lines, a part of the non-uniformly spaced horizontal lines correspond to the first, second and third horizontal lines.

23. A master slice LSI of claim 22, further comprising:

a first wiring disposed on the interlayer insulating film along a vertical direction orthogonal to the horizontal direction, the first wiring formed as a first metal layer directly connecting to a gate contact hole, which is one of the contact holes, disposed on the second rectangular end region of the gate polysilicon; and a set of second wirings disposed on the interlayer insulating film with a constant pitch along the vertical direction, the second wiring formed as a first metal layer directly connecting to a part of the contact holes other than the gate contact hole, a spacing from a center line of the first wiring to the center line of one of the second wirings disposed to nearest to the first wiring is narrower than the constant pitch, wherein the first and second wirings are arranged such that positions of the center lines of the first and second wirings are determined by the non-uniformly spaced perpendicular lines of the grid.

24. A master slice LSI of claim 22, wherein said plurality of basic cell sets has a basic cell set comprising:

a third impurity doped region of the second conductivity type having upper, middle and lower areas, formed at the surface of the semiconductor substrate, the upper, middle and lower areas serving as source and drain regions;

a fourth impurity doped region of the second conductivity type having upper, middle and lower areas, formed at the surface of the semiconductor substrate, the upper, middle and lower areas serving as source and drain regions;

a second contact region of the first conductivity type, sandwiched between the third and fourth impurity doped regions;

a third couple of gate polysilicons disposed along the horizontal direction so as to divide the third impurity doped region into upper, middle and lower areas, each of the gate polysilicons having third and fourth rectangular end regions, the third rectangular end region neighboring to second rectangular end region; and a fourth couple of gate polysilicons disposed along the horizontal direction so as to divide the fourth impurity doped region into upper, middle and lower areas, wherein the interlayer insulating film is disposed on the third and fourth impurity doped regions, and on the third and fourth couples of gate polysilicons.

25. A master slice LSI of claim 24, further comprising:

a third wiring disposed on the interlayer insulating film along the vertical direction, the third wiring being formed as the first metal layer directly connecting to another gate contact hole, which is disposed on the third rectangular end region of the gate polysilicon; and a set of fourth wirings disposed on the interlayer insulating film with the constant pitch along the vertical direction, the fourth wiring formed as the first metal layer directly connecting to the another gate contact hole, the spacing from a center line of the third wiring to the center line of one of the fourth wirings disposed to nearest to the third wiring is narrower than the constant pitch, and same as the spacing from the center line of the first wiring to the center line of one of the second wirings disposed to nearest to the first wiring.

* * * * *